US011852972B2

(12) United States Patent
Marangoni et al.

(10) Patent No.: US 11,852,972 B2
(45) Date of Patent: Dec. 26, 2023

(54) PHOTORESIST COMPOSITIONS AND PATTERN FORMATION METHODS

(71) Applicant: ROHM AND HAAS ELECTRONIC MATERIALS LLC, Marlborough, MA (US)

(72) Inventors: Tomas Marangoni, Marlborough, MA (US); Emad Aqad, Northborough, MA (US); James W. Thackeray, Braintree, MA (US); James F. Cameron, Brookline, MA (US); Xisen Hou, Lebanon, NH (US); ChoongBong Lee, Westborough, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 254 days.

(21) Appl. No.: 17/084,993

(22) Filed: Oct. 30, 2020

(65) Prior Publication Data
US 2022/0137506 A1 May 5, 2022

(51) Int. Cl.
G03F 7/004 (2006.01)
G03F 7/30 (2006.01)
G03F 7/20 (2006.01)

(52) U.S. Cl.
CPC .......... *G03F 7/0045* (2013.01); *G03F 7/2004* (2013.01); *G03F 7/2041* (2013.01); *G03F 7/30* (2013.01)

(58) Field of Classification Search
CPC .... G03F 7/0045; G03F 7/2004; G03F 7/2041; G03F 7/30; G03F 7/0046; G03F 7/0392; G03F 7/0397; G03F 7/004; G03F 7/027; G03F 7/70033; C08G 2261/3222
See application file for complete search history.

(56) References Cited

U.S. PATENT DOCUMENTS

| 4,189,323 | A | | 2/1980 | Buhr | |
|---|---|---|---|---|---|
| 4,513,137 | A | | 4/1985 | Koser et al. | |
| 4,840,977 | A | * | 6/1989 | Crivello | C08G 69/42 525/437 |
| 8,431,325 | B2 | | 4/2013 | Hashimoto et al. | |
| 2003/0013049 | A1 | | 1/2003 | Cameron et al. | |
| 2006/0223010 | A1 | | 10/2006 | Tsuji et al. | |
| 2008/0131811 | A1 | | 6/2008 | Padmanaban et al. | |
| 2008/0161520 | A1 | | 7/2008 | Ishihara et al. | |
| 2009/0176173 | A1 | * | 7/2009 | Glodde | G03F 7/0045 430/323 |
| 2018/0267403 | A1 | * | 9/2018 | Hatakeyama | G03F 7/0046 |

FOREIGN PATENT DOCUMENTS

| EP | 0424124 | A2 | * | 4/1991 | | |
|---|---|---|---|---|---|---|
| EP | 2458440 | A1 | * | 5/2012 | | B23D 79/00 |
| GB | 1491540 | A | * | 11/1977 | | C08F 2/50 |
| JP | 05232705 | A | | 9/1993 | | |
| JP | 06266110 | A | | 9/1994 | | |
| JP | 09183960 | A | | 7/1997 | | |
| JP | 11153870 | A | * | 6/1999 | | |
| JP | 11153870 | A | | 6/1999 | | |
| JP | 2004219963 | A | | 8/2004 | | |
| JP | 2005189501 | A | | 7/2005 | | |
| JP | 2011154216 | A | * | 8/2011 | | |
| JP | 2013064986 | A | | 4/2013 | | |
| WO | 0219033 | A2 | | 3/2002 | | |

OTHER PUBLICATIONS

Martín-Santamaría, Sonsoles, et al. "Fluoridation of heteroaromatic iodonium salts—experimental evidence supporting theoretical prediction of the selectivity of the process." Chemical Communications 8 (2000): 649-650. (Year: 2000).*
Carroll et al., "New synthesis of diaryliodonium sulfonates from arylboronic acids", Tetrahedron Letters 41 (2000) 5393-5396.
Goldfarb et al., "Acid generation efficiency: EUV photons versus photoelectrons", Proc. SPIE 9779, 2016, 14 pages.
Masuda et al., "The material design to reduce outgassing in acetal-based chemically amplified resist for EUV lithography", Proc. of SPIE vol. 6153 615342-1, 2006, 9 pages.

(Continued)

Primary Examiner — Mark F. Huff
Assistant Examiner — Moriah S. Smoot
(74) Attorney, Agent, or Firm — CANTOR COLBURN LLP

(57) ABSTRACT

A photoresist composition, comprising an acid-sensitive polymer comprising a repeating unit having an acid-labile group; an iodonium salt comprising an anion and a cation, the iodonium salt having Formula (1):

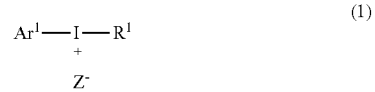

wherein $Z^-$ is an organic anion; $Ar^1$ is substituted or unsubstituted $C_{4\text{-}60}$ heteroaryl group comprising a furan heterocycle; and $R^1$ is substituted or unsubstituted hydrocarbon group as provided herein, wherein the cation optionally comprises an acid-labile group, wherein $Ar^1$ and $R^1$ are optionally connected to each other via a single bond or one or more divalent linking groups to form a ring, and wherein the iodonium salt is optionally covalently bonded through $Ar^1$ or substituent thereof as a pendant group to a polymer, the iodonium salt is optionally covalently bonded through $R^1$ or substituent thereof as a pendant group to a polymer, or the iodonium salt is optionally covalently bonded through $Z^-$ as a pendant group to a polymer; and a solvent.

17 Claims, No Drawings

(56) References Cited

OTHER PUBLICATIONS

Pinto de Magalhaes et al., "Reductive Eliminations from λ3-Iodanes:Understanding Selectivity and the Crucial Role of the Hypervalent Bond", Oragnic Letters, 2012, vol. 14, No. 15, 3830-3833.

Pinto de Magalhaes et al., "Breaking Down the Reactivity of λ3-Iodanes: The Impact of Structure and Bonding on Competing Reaction Mechanisms", The Journal of Organic Chemistry, 2014, 79, 8374-8382.

Wang et al., Regiospecific Reductive Elimination from Diaryliodonium Salts, Angew. Chem. Int. Ed. 2010, 49, 4079-4083.

* cited by examiner

PHOTORESIST COMPOSITIONS AND PATTERN FORMATION METHODS

FIELD

The present invention relates to photoresist compositions and to pattern formation methods using such photoresist compositions. The invention finds particular applicability in lithographic applications in the semiconductor manufacturing industry.

BACKGROUND

Photoresist materials are photosensitive compositions typically used for transferring an image to one or more underlying layers such as a metal, semiconductor or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a polymer having acid-labile groups and a photoacid generator (PAG). Pattern-wise exposure to activating radiation through a photomask causes the acid generator to form an acid which, during post-exposure baking, causes cleavage of the acid-labile groups in exposed regions of the polymer. This creates a difference in solubility characteristics between exposed and unexposed regions of the resist in a developer solution. In a positive tone development (PTD) process, exposed regions of the photoresist layer become soluble in the developer and are removed from the substrate surface, whereas unexposed regions, which are insoluble in the developer, remain after development to form a positive-tone image. The resulting relief image permits selective processing of the substrate. See, e.g., Uzodinma Okoroanyanwu, Chemistry and Lithography, SPIE Press and John Wiley and Sons, Inc., 2010 and Chris Mack, Fundamental Principles of Optical Lithography, John Wiley and Sons, Inc., 2007.

One approach to achieving nm-scale feature sizes in semiconductor devices is the use of short wavelengths of light, for example, 193 nanometers (nm) or less, during exposure of chemically amplified photoresists. To further improve lithographic performance, immersion lithography tools have been developed to effectively increase the numerical aperture (NA) of the lens of the imaging device, for example, a scanner having a KrF (248 nm) or ArF (193 nm) light source. This is accomplished by use of a relatively high refractive index fluid, typically water, between the last surface of the imaging device and the upper surface of the semiconductor wafer. ArF immersion tools are currently pushing the boundaries of lithography to the 16 nm and 14 nm nodes with the use of multiple (double or higher order) patterning schemes. The use of multiple patterning, however, is generally costly in terms of increased materials usage and number of processing steps required, as compared with single step, directly imaged patterns. This has provided motivation for development of next-generation technologies, such as extreme ultraviolet (EUV) lithography and e-beam lithography. However, as lithographic resolution becomes increasingly higher, linewidth roughness (LWR), critical dimension uniformity (CDU), and sensitivity of the photoresist patterns have become of increased importance in forming high-fidelity patterns.

EUV and e-beam photoresist compositions and their use have been described in the literature. For example, Japanese patent document JP9183960A discloses PAG compounds that use organoborate anions as counterpart to the iodonium cation. However, the use of boron-containing compounds in lithographic processing is problematic due to contamination risks of the silicon surface, such as with unwanted doping with boron that could unfavorably alter the electronic properties.

Japanese patent document JP1999153870A discloses onium compounds having a furan moiety incorporated into a polycationic structure. The use of polycationic structures unfavorably increases the polarity of the PAG compound and reduces their solubility in organic solvents. The reduced solubility ultimately limits their use in photoresist compositions. In addition, the use of poorly soluble onium salts in photoresist compositions typically results in aggregation in the film over extended periods of time and this translates into unreliable lithographic performance.

There remains a continued need for photoresist compositions to address one or more problems associated with the state of the art. In particular, there is a continuing need for photoresist compositions having good sensitivity at 193 nm and EUV wavelengths, including photoresist compositions having good solubility and that can provide an increased absorption at EUV wavelength.

SUMMARY

Provided is a photoresist composition comprising an acid-sensitive polymer comprising a repeating unit having an acid-labile group; an iodonium salt comprising an anion and a cation, the iodonium salt having Formula (1):

wherein $Z^-$ is an organic anion comprising a group chosen from sulfonate, a methide anion, an anion of a sulfonamide, an anion of a sulfonimide, a sulfamate, a phenolate, or carboxylate; $Ar^1$ is a substituted or unsubstituted $C_{4-60}$ heteroaryl group comprising a furan heterocycle; and $R^1$ is a $C_{1-20}$ alkyl group, a $C_{1-20}$ heteroalkyl group, a $C_{3-20}$ cycloalkyl group, a $C_{2-20}$ heterocycloalkyl group, a $C_{2-20}$ alkenyl group, a $C_{2-20}$ heteroalkenyl group, a $C_{6-30}$ aryl group, a $C_{4-30}$ heteroaryl group, a $C_{7-20}$ arylalkyl group, or a $C_{4-20}$ heteroarylalkyl group, each of which is substituted or unsubstituted, wherein the cation optionally comprises an acid-labile group, wherein $Ar^1$ and $R^1$ are optionally connected to each other via a single bond or one or more divalent linking groups to form a ring, and wherein the iodonium salt is optionally covalently bonded through $Ar^1$ or through a substituent thereof as a pendant group to a polymer, the iodonium salt is optionally covalently bonded through $R^1$ or through a substituent thereof as a pendant group to a polymer, or the iodonium salt is optionally covalently bonded through $Z^-$ as a pendant group to a polymer; and a solvent.

Also provided is a pattern formation method comprising (a) applying a layer of the inventive photoresist composition on a substrate; (b) pattern-wise exposing the photoresist composition layer to activating radiation; and (c) developing the exposed photoresist composition layer to provide a resist relief image.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(═O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of two; "cycloalkenyl group" refers to a non-aromatic cyclic divalent hydrocarbon group having at least three carbon atoms, with at least one carbon-carbon double bond; "alkynyl group" refers to a monovalent hydrocarbon group having at least one carbon-carbon triple bond; the term "aromatic group" refers to a monocyclic or polycyclic ring system that satisfies the Huckel Rule and includes carbon atoms in the ring, and optionally may include one or more heteroatoms selected from N, O, and S instead of a carbon atom in the ring; "aryl group" refers to a monovalent aromatic monocyclic or polycyclic ring system where every ring member is carbon, and may include a group with an aromatic ring fused to at least one cycloalkyl or heterocycloalkyl ring; "arylene group" refers to an aryl group having a valence of two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroatom-containing group" refers to a substituent group that includes at least one heteroatom; "heteroalkyl group" refers to an alkyl group having 1-4 heteroatoms instead of carbon; "heterocycloalkyl group" refers to a cycloalkyl group having 1-4 heteroatoms as ring members instead of carbon; "heterocycloalkylene group" refers to a heterocycloalkyl group having a valence of two; "heteroaryl group" refers to an aryl group having 1-4 heteroatoms as ring members instead of carbon; and "heteroarylene group" refers to an heteroaryl group having a valence of two.

The term "halogen" means a monovalent substituent that is fluorine (fluoro), chlorine (chloro), bromine (bromo), or iodine (iodo). The prefix "halo" means a group including one or more of a fluoro, chloro, bromo, or iodo substituent instead of a hydrogen atom. A combination of halo groups (e.g., bromo and fluoro), or only fluoro groups may be present.

"Fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$). A "substituted fluoroalkyl group" shall be understood to mean a fluoroalkyl group that is further substituted by an additional substituent group.

"Substituted" means that at least one hydrogen atom on the group is replaced with another group, provided that the designated atom's normal valence is not exceeded. When the substituent is oxo (i.e., ═O), then two hydrogens on the carbon atom are replaced. Combinations of substituents or variables are permissible. Exemplary groups that may be present on a "substituted" position include, but are not limited to, nitro (—$NO_2$), cyano (—CN), hydroxy (—OH), oxo (═O), amino (—$NH_2$), mono- or di-($C_{1-6}$)alkylamino, alkanoyl (such as a $C_{2-6}$ alkanoyl group such as acyl), formyl (—C(═O)H), carboxylic acid or an alkali metal or ammonium salt thereof; esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl); amido (—C(=O)NR$_2$ wherein R is hydrogen or $C_{1-6}$ alkyl), carboxamido (—CH$_2$C(=O)NR$_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a $C_2$ alkyl group substituted with a cyano group.

As used herein, an "acid-labile group" refers to a group in which a bond is cleaved by the catalytic action of an acid, optionally and typically with thermal treatment, resulting in formation of a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

As discussed above, there remains a continuing need for photoresist compositions having improved sensitivity at 193 nm and EUV wavelengths, which, for example, may allow for higher throughput in semiconductor manufacturing. The inventors have discovered that the incorporation of an oxygen-containing heterocycle (e.g. furan or benzofuran) can be used to improve photoresist sensitivity at both 193 nm and EUV exposure wavelengths. These results are unexpected in view of both JP9183960A and P1999153870A, as noted above, where the iodonium salts containing a furan subunit showed limited lithographic performance.

Accordingly, the present invention relates to photoresist compositions that contain an acid-sensitive polymer comprising a repeating unit having an acid-labile group, an iodonium salt, a solvent, and may contain additional, optional components. The inventors have surprisingly discovered that particular photoresist compositions of the invention can achieve notably improved lithographic performance, such as higher EUV absorbance, faster photo-speed, and good solubility in organic solvents.

The iodonium salt includes an iodonium cation and an anionic moiety, which for convenience may be referred to herein as the cation portion and the anion portion of the iodonium salt, respectively. The iodonium salt is photo-decomposable and generates an acid on photodecomposition. The strength of the photo-generated acid can vary widely depending on the anion portion. The iodonium salt may serve various functions in the composition depending on the strength of the generated acid and other components of the photoresist composition. For example, in one aspect, the iodonium salt may serve as a source of acid for deprotecting acid-labile groups on the acid-sensitive polymer. In another aspect, the iodonium salt may serve as a photo-decomposable quencher when used in combination with a photoacid generator (PAG) compound that is different than the iodonium salt, wherein the corresponding photoacid of the PAG has a lower pKa than a corresponding photoacid of the inventive iodonium salt. The photo-generated acid from the iodonium salt may, for example, have a pKa from −20 to 20, from −15 to 15, from −12 to 12, from −15 to −1, or from greater than −1 to 6.

The iodonium salt is of formula (1):

(1)

In Formula (1), $Ar^1$ is a substituted or unsubstituted $C_{4-60}$ heteroaryl group comprising a furan heterocycle.

In Formula (1), $R^1$ is a $C_{1-20}$ alkyl group, a $C_{1-20}$ heteroalkyl group, a $C_{3-20}$ cycloalkyl group, a $C_{2-20}$ heterocycloalkyl group, a $C_{2-20}$ alkenyl group, a $C_{2-20}$ heteroalkenyl group, a $C_{6-30}$ aryl group, a $C_{4-30}$ heteroaryl group, a $C_{7-20}$ arylalkyl group, or a $C_{4-20}$ heteroarylalkyl group, each of which is substituted or unsubstituted.

In some aspects, $Ar^1$ may be a $C_{4-60}$ heteroaryl group chosen from:

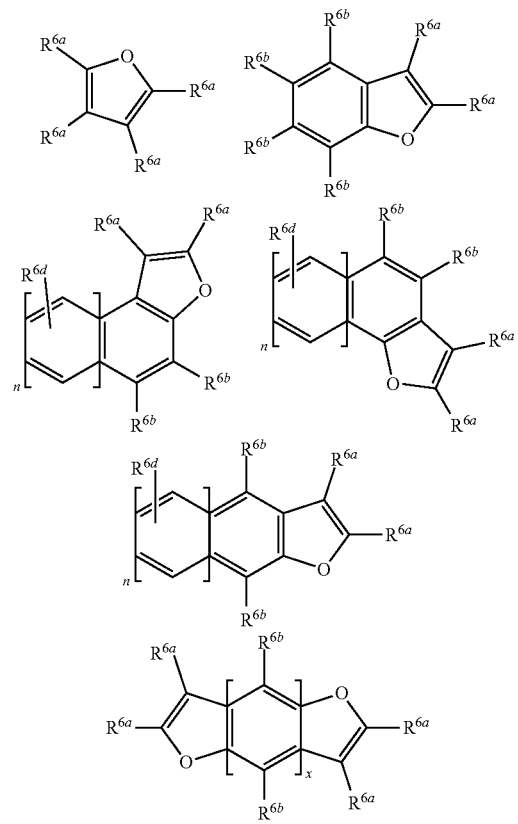

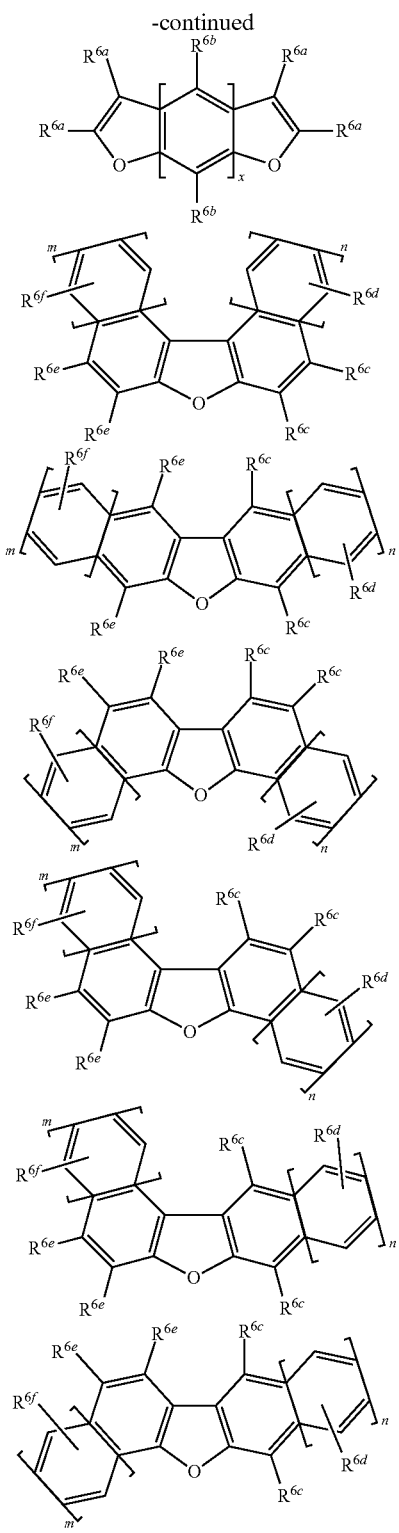

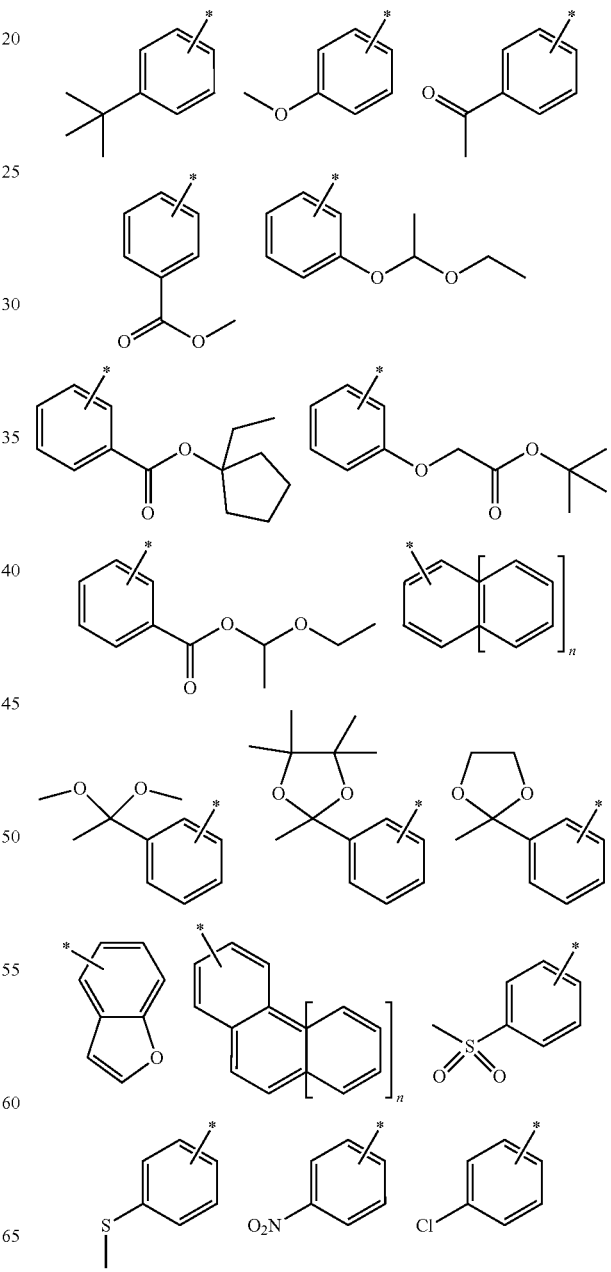

wherein $R^{6a}$, $R^{6b}$, $R^{6c}$, $R^{6d}$, $R^{6e}$, and $R^{6f}$ are each independently a single bond, hydrogen, substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, —$OR^{61}$, —$SR^{62}$, or —$NR^{63}R^{64}$, wherein $R^{61}$ to $R^{64}$ are each independently hydrogen, or substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl, provided that one of $R^{6a}$, $R^{6b}$, $R^{6c}$, $R^{6d}$, $R^{6e}$, or $R^{6f}$ is a single bond to the iodonium cation. In the above formulae, m is an integer from 0 to 6, n is an integer from 0 to 6, and x is an integer from 1 to 6.

In some aspects, $R^1$ may include one or more of the following formulas as all or part of its structure:

-continued

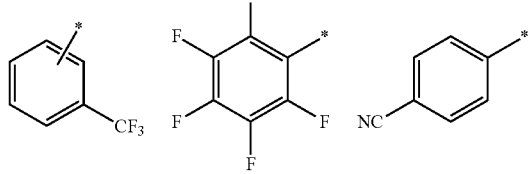

wherein n is an integer of 0 to 6 and "*" represents the attachment point to the iodine atom.

In some aspects, $R^1$ may be a $C_{4-60}$ heteroaryl group, wherein the $C_{4-60}$ heteroaryl group is as defined above for $Ar^1$. When $R^1$ is a $C_{4-60}$ heteroaryl group, $Ar^1$ and $R^1$ may be the same as each other or different from each other.

Exemplary cation portions of formula (1) include the following:

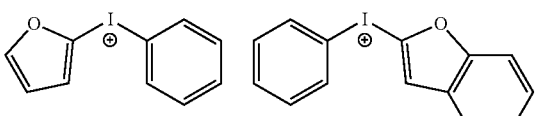
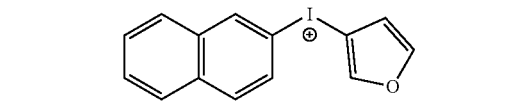
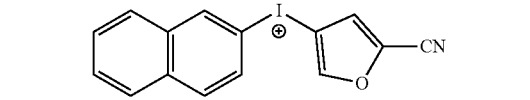
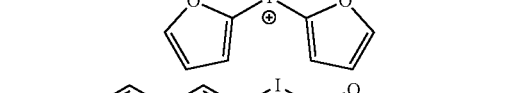
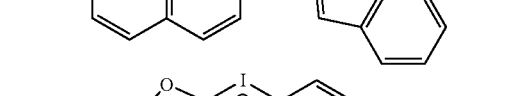
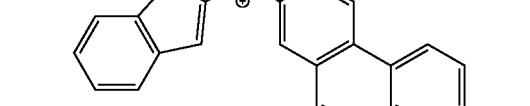
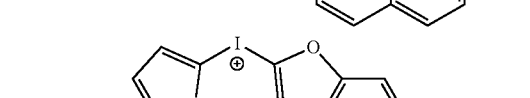
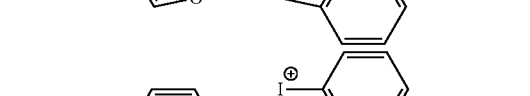
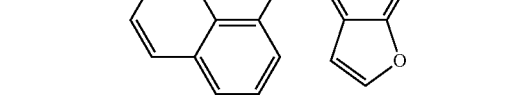

-continued

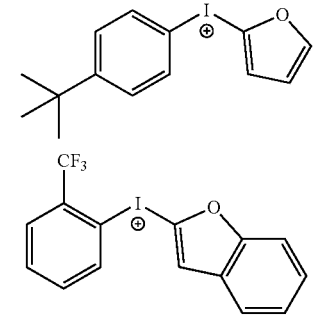
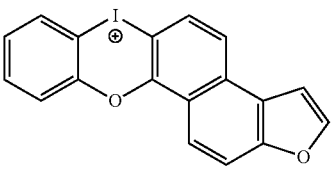
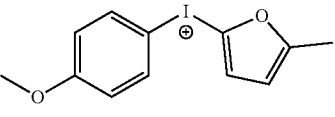
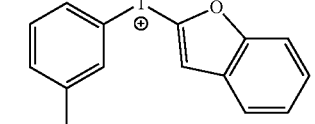
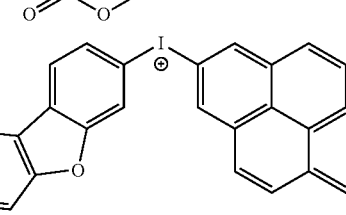
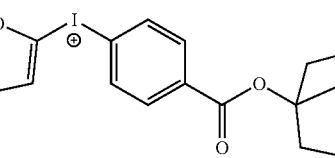
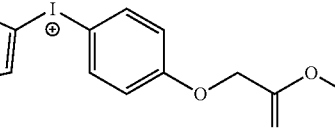
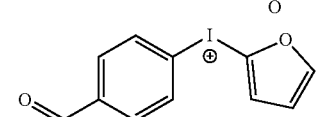
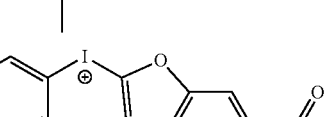
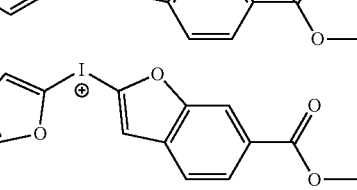

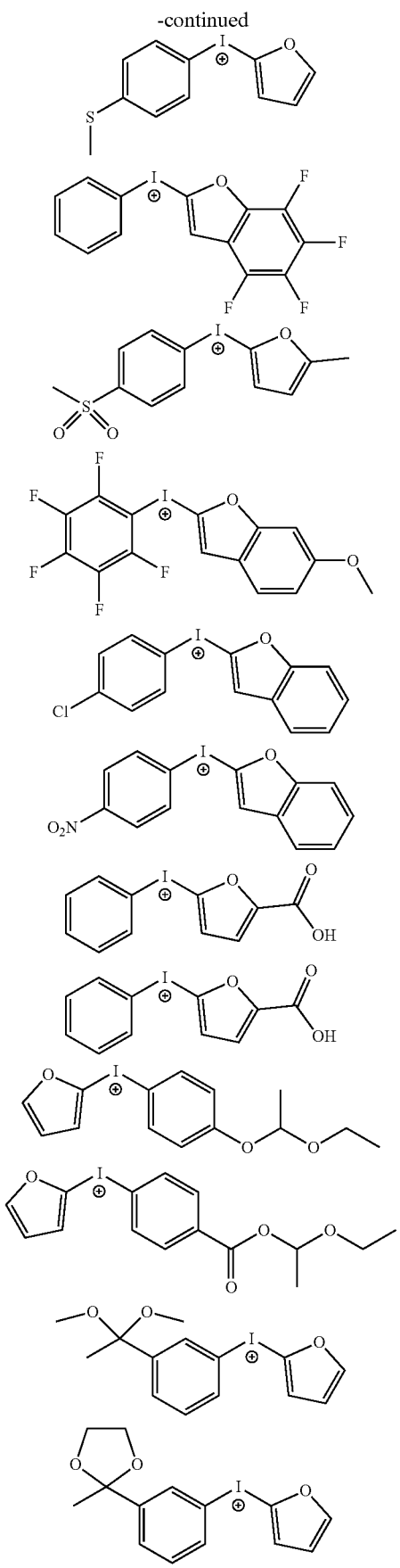

In some aspects, $Ar^1$ and $R^1$ may be optionally connected to each other via a single bond or one or more divalent linking group(s) L to form a ring having formula (1a):

$$Ar_1-I^+ \atop L-R_1 \qquad (1a)$$

Suitable divalent linking group(s) L include, for example, one or more of —O—, —S—, —Te—, —Se—, —C(O)—, —C(O)—O—, —N($R^a$)—, —C(O)—N($R^{2a}$), —S(O)—, —S(O)$_2$—, —N($R^{2a}$)—S(O)$_2$—, —C(S)—, —C(Te)—, —C(Se)—, substituted or unsubstituted $C_1$-30 alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{7-30}$ arylalkylene, substituted or unsubstituted $C_1$-30 heteroarylene, substituted or unsubstituted $C_{3-30}$ heteroarylalkylene, or a single bond forming part of a ring with $Ar^1$ or $R^1$; wherein $R^a$ and $R^{2a}$ s hydrogen, $C_{1-20}$ alkyl, $C_{1-20}$ heteroalkyl, $C_{6-30}$ aryl, or $C_{4-30}$ heteroaryl, each of which except for hydrogen may be substituted or unsubstituted. Preferably, $Ar^1$ and $R^1$ may be optionally connected to each other via one or more of —O—, —S—, —Te—, —Se—, —C(O)—, —C(S)—, —C(Te)—, —C(Se)—, or substituted or unsubstituted $C_{1-5}$ alkylene.

Non-limiting examples where $Ar^1$ and $R^1$ are connected to each other via a single bond or one or more divalent linking group(s) to form a ring of formula (1a) include:

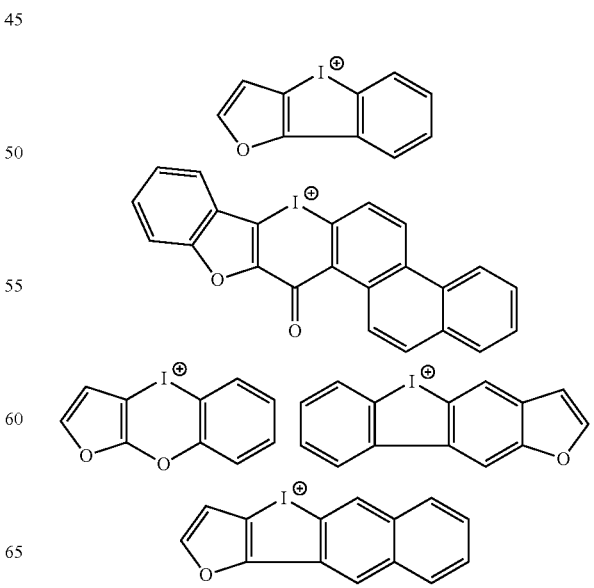

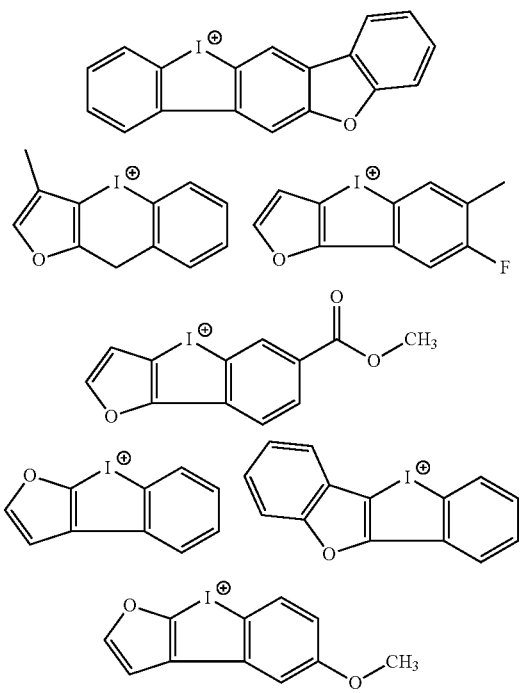

The iodonium salt of formula (1) may be included in the photoresist composition as a non-polymeric compound and/or in polymeric form, for example, present in a polymerized repeating unit of the acid-sensitive polymer as described herein, or as part of a different polymer. In some aspects, the iodonium salt of formula (1) may be optionally covalently bonded through $Ar^1$ or $R^1$, or through a respective substituent of $Ar^1$ or $R^1$, as a pendant group to a polymer, or for example the iodonium salt of formula (1) may be optionally covalently bonded through $Z^-$ as a pendant group to a polymer. That is, the iodonium salt of formula (1) optionally may be covalently bonded through $Ar^1$ or through a substituent thereof as a pendant group to a polymer, the iodonium salt of formula (1) optionally may be covalently bonded through $R^1$ or through a substituent thereof as a pendant group to a polymer, or the anion portion of the iodonium salt of formula (1) optionally may be covalently bonded through $Z^-$ as a pendant group to a polymer. For example, the pendant group may be attached to a main chain or backbone of the polymer.

For example, a polymer optionally may comprise a repeating unit comprising the iodonium salt, for example a repeating unit derived from one or more monomers of formulas (2a), (2b), or (3):

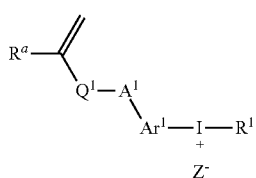

(2a)

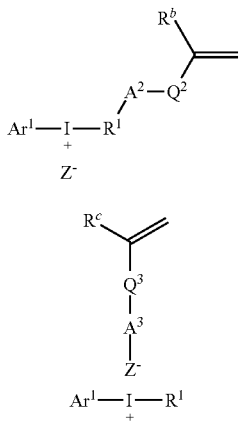

(2b)

(3)

wherein $Ar^1$ and $R^1$ are as defined herein.

In formulas (2a), (2b), and (3), $R^a$, $R^b$, and $R^c$ are each independently hydrogen, fluorine, cyano, a substituted or unsubstituted $C_{1-10}$ alkyl, or a substituted or unsubstituted fluoroalkyl. Preferably, $R^a$, $R^b$, and $R^c$ are each independently hydrogen, fluorine, or substituted or unsubstituted $C_{1-5}$ alkyl, typically methyl.

In formulas (2a), (2b), and (3), $Q^1$, $Q^2$, and $Q^3$ are each independently a single bond or a divalent linking group chosen from one or more of a heteroatom, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{4-30}$ heteroarylene, or a combination thereof. Preferably, $Q^1$, $Q^2$, and $Q^3$ each independently may include 1 to 10 carbon atoms and at least one heteroatom, more preferably —C(O)—O—.

In formulas (2a), (2b), and (3), $A^1$, $A^2$, and $A^3$ are each independently one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, or substituted or unsubstituted $C_{4-30}$ heteroarylene. Preferably, $A^1$, $A^2$, and $A^3$ are each independently a divalent $C_{1-30}$ perfluoroalkylene group that is optionally substituted.

In formulas (1), (2a), (2b), and (3), $Z^-$ is an organic anion comprising a group chosen from sulfonate, a methide anion, an anion of a sulfonamide, an anion of a sulfonimide, a sulfamate, a phenolate, or a carboxylate.

Exemplary organic anions having a sulfonate group include the following:

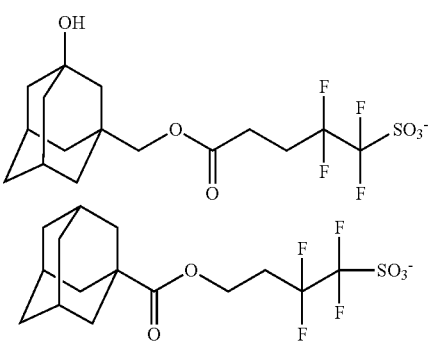

-continued
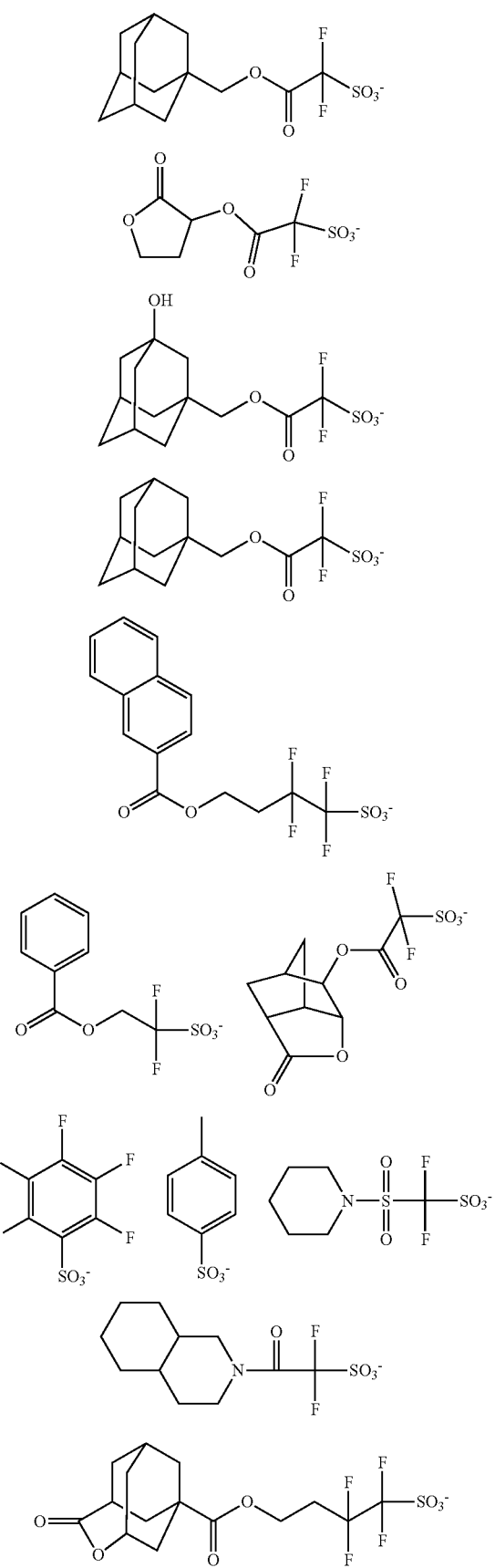
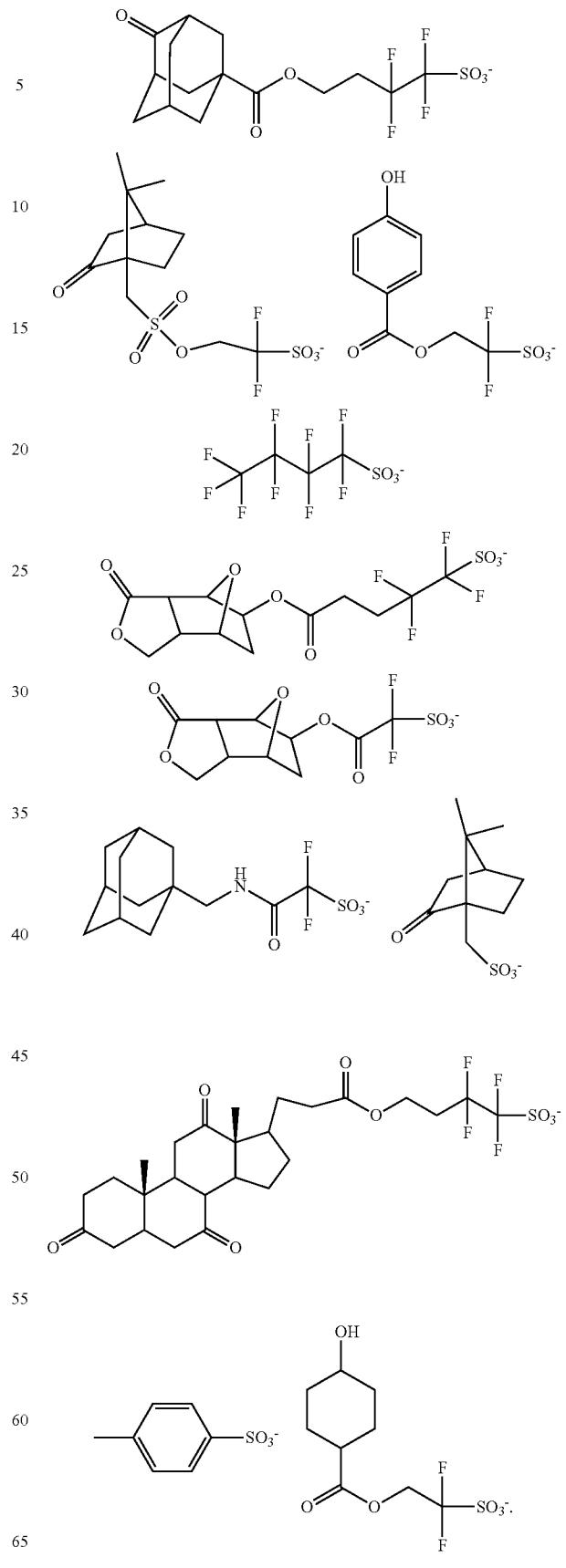

Exemplary non-sulfonated organic anions include the following:
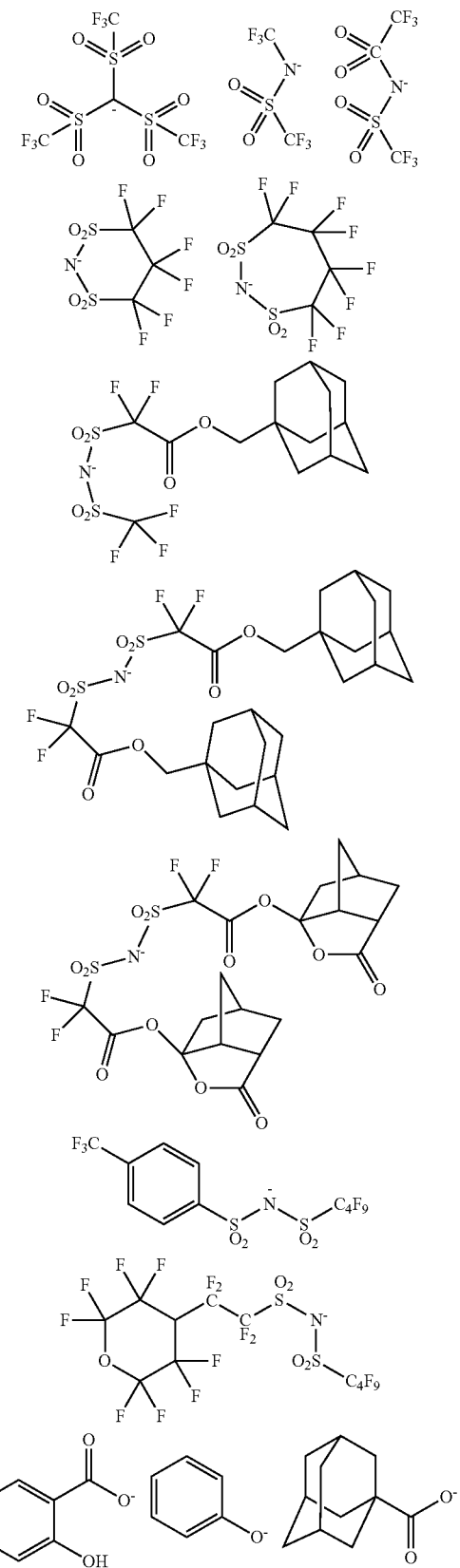
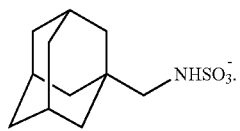
In some aspects, the iodonium salt may be covalently bonded through $Z^-$ as a pendant group to a polymer. Such iodonium salts can include repeating units derived from exemplary monomers of formula (3):
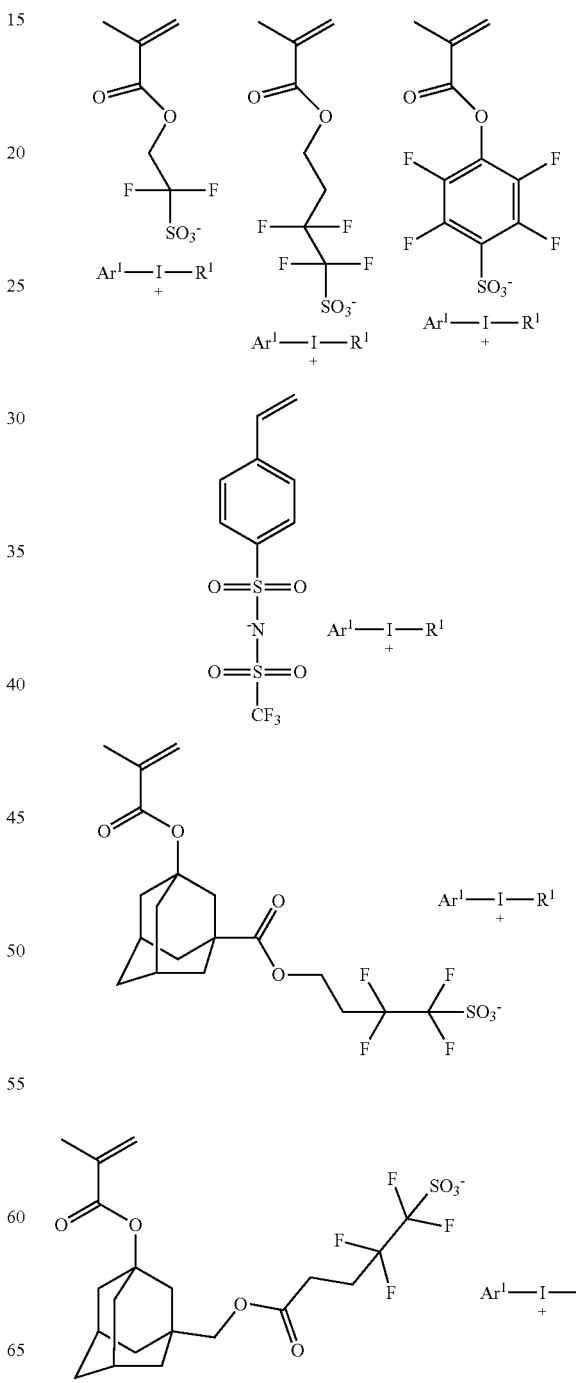

-continued

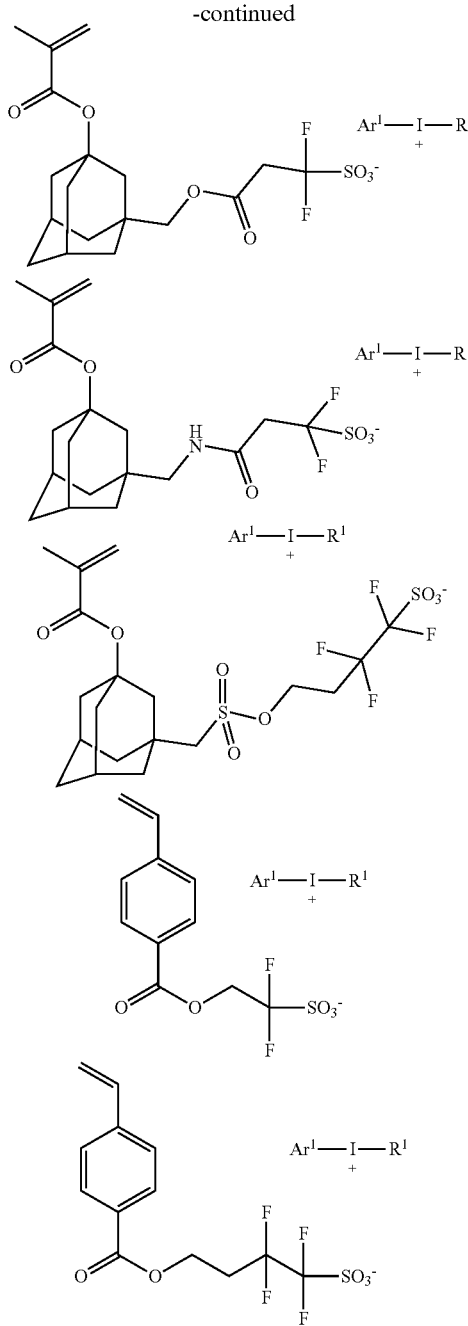

wherein Ar¹ and R¹ are as defined herein.

If used in a polymer, such iodonium salt-containing repeating units are typically present in an amount from 1 to 20 mol %, more typically from 1 to 10 mol %, and still more typically from 2 to 8 mol %, based on total repeating units in the polymer.

The polymer may optionally include one or more additional repeating unit(s) different from the repeating unit comprising the iodonium salt. The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the polymer are typically used in an amount of up to 99 mol %, and typically from 3 to 80 mol %, based on total repeating units of the polymer.

The polymer typically has a $M_w$ of 1,000 to 50,000 Da, specifically 2,000 to 30,000 Da, more specifically 3,000 to 20,000 Da, still more specifically 3,000 to 10,000 Da. The PDI of the polymer, which is the ratio of $M_w$ to $M_n$ is typically 1.1 to 3, specifically 1.1 to 2. Molecular weights are determined by GPC using polystyrene standards.

In some aspects, the cation portion of the iodonium salt of formula (1) may include an acid-labile group, which can be cleaved by photo-generated acid at post-exposure bake conditions. In formula (1), each of Ar¹ and R¹ may optionally include an acid-labile group chosen, for example, from tertiary alkyl ester groups, tertiary aryl ester groups, tertiary ester groups having a combination of alkyl and aryl groups, tertiary alkoxy groups, acetal groups, or ketal groups. Suitable divalent linking groups for connection of the acid-labile group to the respective Ar¹ or R¹ groups may comprise —O—, —S—, —Te—, —Se—, —C(O)—, —C(O)O—, —C(S)—, —C(S)—O—, C(O)—S, —C(Te)—, —S(O)—, —S(O)₂—, —N(R)—, —C(Se)—, substituted or unsubstituted $C_{1-5}$ alkylene, and combinations thereof, wherein R is hydrogen, $C_{1-20}$ alkyl, $C_{1-20}$ heteroalkyl, $C_{6-30}$ aryl, or $C_{4-30}$ heteroaryl, each of which except for hydrogen can be substituted or unsubstituted. Alternatively, the acid-labile group may be connected to the respective Ar¹ or R¹ groups via a single bond, that is, in some embodiments the divalent linking group may be omitted.

The acid-sensitive polymer of the invention comprises a repeating unit having an acid-labile group. For example, the repeating unit having an acid-labile group may be derived from one or more monomers of formulas (4a), (4b), (4c), (4d), or (4e):

(4a)

(4b)

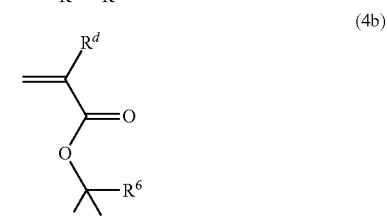

(4c)

-continued

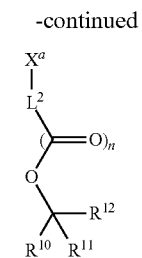

(4d)

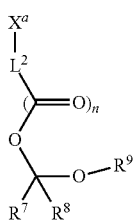

(4e)

In formulas (4a), (4b), and (4c), $R^d$ is hydrogen, fluorine, cyano, substituted or unsubstituted $C_{1-10}$ alkyl, or substituted or unsubstituted $C_{1-10}$ fluoroalkyl. Preferably, $R^d$ is hydrogen, fluorine, or substituted or unsubstituted $C_{1-5}$ alkyl, typically methyl.

In formula (4a), $L^1$ is a divalent linking group including at least one carbon atom, at least one heteroatom, or a combination thereof. For example, $L^2$ may include 1 to 10 carbon atoms and at least one heteroatom. In a typical example, $L^1$ may be $—OCH_2—$, $—OCH_2CH_2O—$, or $—N(R^{21})—$, wherein $R^{21}$ is hydrogen or $C_{1-6}$ alkyl.

In formulas (4a) and (4b), $R^1$ to $R^6$ are each independently hydrogen, straight chain or branched $C_{1-20}$ alkyl, a monocyclic or polycyclic $C_{3-20}$ cycloalkyl, a monocyclic or polycyclic $C_{1-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{2-20}$ heteroaryl, each of which except hydrogen is substituted or unsubstituted; provided that only one of $R^1$ to $R^3$ can be hydrogen and only one of $R^4$ to $R^6$ can be hydrogen, and provided that when one of $R^1$ to $R^3$ is hydrogen, one or both of the others of $R^1$ to $R^3$ are a substituted or unsubstituted monocyclic or polycyclic $C_{6-20}$ aryl or a substituted or unsubstituted monocyclic or polycyclic $C_{4-20}$ heteroaryl, and when one of $R^4$ to $R^6$ is hydrogen, one or both of the others of $R^4$ to $R^6$ are a substituted or unsubstituted monocyclic or polycyclic $C_{6-20}$ aryl or a substituted or unsubstituted monocyclic or polycyclic $C_{4-20}$ heteroaryl. Preferably, $R^1$ to $R^6$ are each independently a straight chain or branched $C_{1-6}$ alkyl, or a monocyclic or polycyclic $C_{3-10}$ cycloalkyl, each of which is substituted or unsubstituted.

In formula (4a), any two of $R^1$ to $R^3$ together optionally form a ring, and each of $R^1$ to $R^3$ optionally may include as part of their structure one or more groups chosen from $—O—$, $—C(O)—$, $—C(O)—O—$, $—S—$, $—S(O)_2—$, and $—N(R^{42})—S(O)_2—$, wherein $R^{42}$ may be hydrogen, a straight chain or branched $C_{1-20}$ alkyl, monocyclic or polycyclic $C_{3-20}$ cycloalkyl, or monocyclic or polycyclic $C_{1-20}$ heterocycloalkyl. In formula (4b), any two of $R^4$ to $R^6$ together optionally form a ring, and each of $R^4$ to $R^6$ optionally may include as part of their structure one or more groups chosen from $—O—$, $—C(O)—$, $—C(O)—O—$, $—S—$, $—S(O)_2—$, and $—N(R^{43})—S(O)_2—$, wherein $R^{43}$ is hydrogen, a straight chain or branched $C_{1-20}$ alkyl, monocyclic or polycyclic $C_{3-20}$ cycloalkyl, or monocyclic or polycyclic $C_{1-20}$ heterocycloalkyl. For example, any one or more of $R^1$ to $R^6$ can be independently a group of the formula $—CH_2C(=O)CH_{(3-n)}Y_n$, where each Y is independently a substituted or unsubstituted $C_{1-30}$ heterocycloalkyl and n is 1 or 2. For example, each Y may be independently a substituted or unsubstituted $C_{1-30}$ heterocycloalkyl including a group of the formula $—O(C^{a1})(C^{a2})O—$, wherein $C^{a1}$ and $C^{a2}$ are each independently hydrogen or a substituted or unsubstituted alkyl, and where $C^{a1}$ and $C^{a2}$ together optionally form a ring.

In formulas (4c) and (4e), $R^7$ to $R^8$ may be each independently hydrogen, straight chain or branched $C_{1-20}$ alkyl, a monocyclic or polycyclic $C_{3-20}$ cycloalkyl, a monocyclic or polycyclic $C_{3-20}$ heterocycloalkyl, a monocyclic or polycyclic $C_{6-20}$ aryl, or a monocyclic or polycyclic $C_{2-20}$ heteroaryl, each of which is substituted or unsubstituted; and $R^9$ is straight chain or branched $C_{1-20}$ alkyl, monocyclic or polycyclic $C_{3-20}$ cycloalkyl, or monocyclic or polycyclic $C_{1-30}$ heterocycloalkyl, each of which is substituted or unsubstituted. Optionally, one of $R^7$ or $R^8$ together with $R^9$ forms a heterocyclic ring. Preferably, $R^7$ and $R^8$ may be each independently hydrogen, straight chain or branched $C_{1-20}$ alkyl, monocyclic or polycyclic $C_{3-20}$ cycloalkyl, or monocyclic or polycyclic $C_{1-20}$ heterocycloalkyl.

In formula (4d), $R^{10}$ to $R^{12}$ may be each independently hydrogen, straight chain or branched $C_{1-20}$ alkyl, a monocyclic or polycyclic $C_{3-20}$ cycloalkyl, a monocyclic or polycyclic $C_{1-20}$ heterocycloalkyl, a monocyclic or polycyclic $C_{6-20}$ aryl, or a monocyclic or polycyclic $C_{2-20}$ heteroaryl, each of which except hydrogen is substituted or unsubstituted, any two of $R^{10}$ to $R^{12}$ together optionally form a ring, and each of $R^{10}$ to $R^{12}$ optionally may include as part of their structure one or more groups chosen from $—O—$, $—C(O)—$, $—C(O)—O—$, $—S—$, $—S(O)_2—$, and $—N(R^{44})—S(O)_2—$, wherein $R^{44}$ may be hydrogen, a straight chain or branched $C_{1-20}$ alkyl, monocyclic or polycyclic $C_{3-20}$ cycloalkyl, or monocyclic or polycyclic $C_{1-20}$ heterocycloalkyl; provided that only one of $R^{10}$ to $R^{12}$ can be hydrogen when the acid-labile group is not an acetal group, provided that when one of $R^{10}$ to $R^{12}$ is hydrogen, one or both of the others of $R^{10}$ to $R^{12}$ are a substituted or unsubstituted monocyclic or polycyclic $C_{6-20}$ aryl or a substituted or unsubstituted monocyclic or polycyclic $C_{4-20}$ heteroaryl.

In formulas (4d) and (4e), $X^a$ is a polymerizable group selected from vinyl and norbornyl; and $L^2$ is a single bond or a divalent linking group, provided that $L^2$ is not a single bond when $X^a$ is vinyl. Preferably, $L^2$ is a monocyclic or polycyclic $C_{6-30}$ arylene or a monocyclic or polycyclic $C_{6-30}$ cycloalkylene, each of which can be substituted or unsubstituted. In formulas (4d) and (4e), n is 0 or 1. It is to be understood that when n is 0, the $L^2$ group is connected directly to the oxygen atom.

Non-limiting examples of monomers (4a) include:

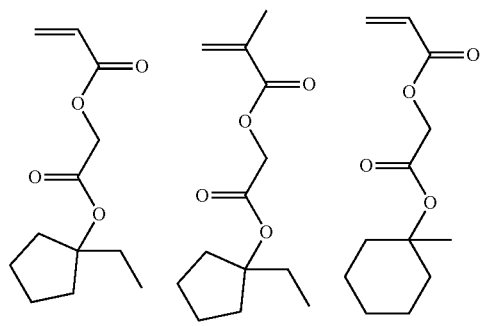

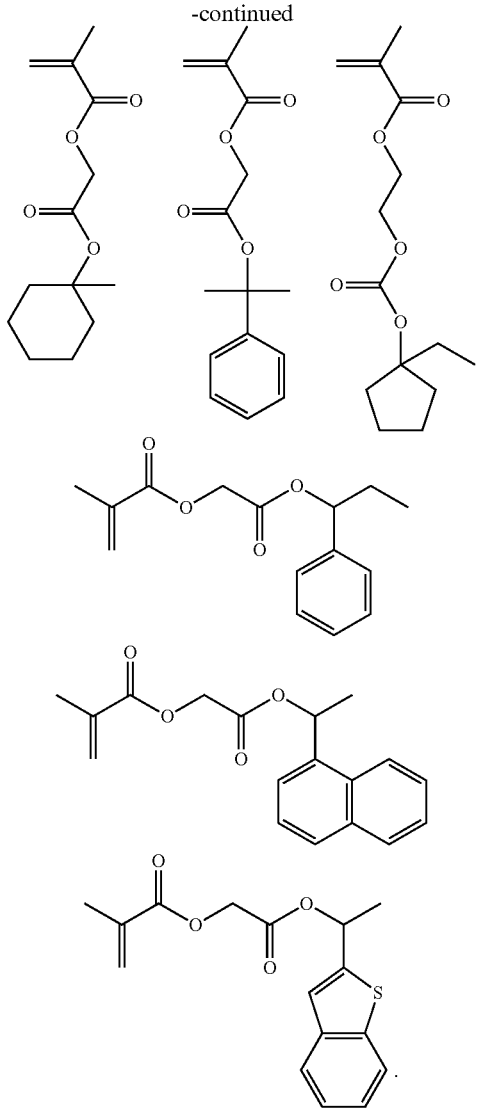
Non-limiting examples of monomers of formula (4b) include:
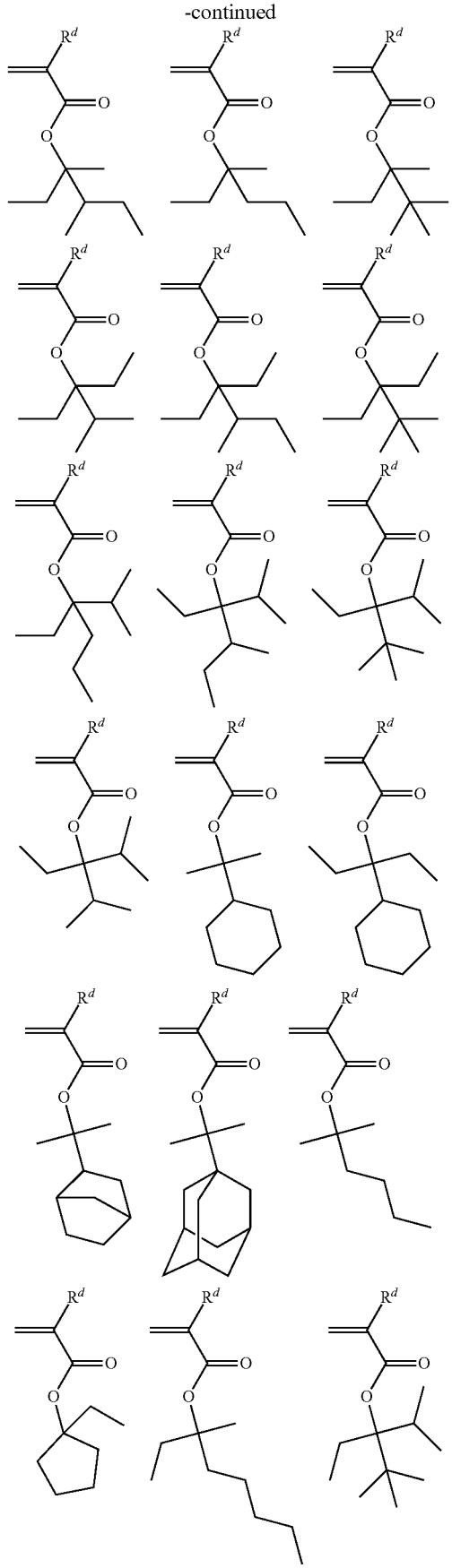

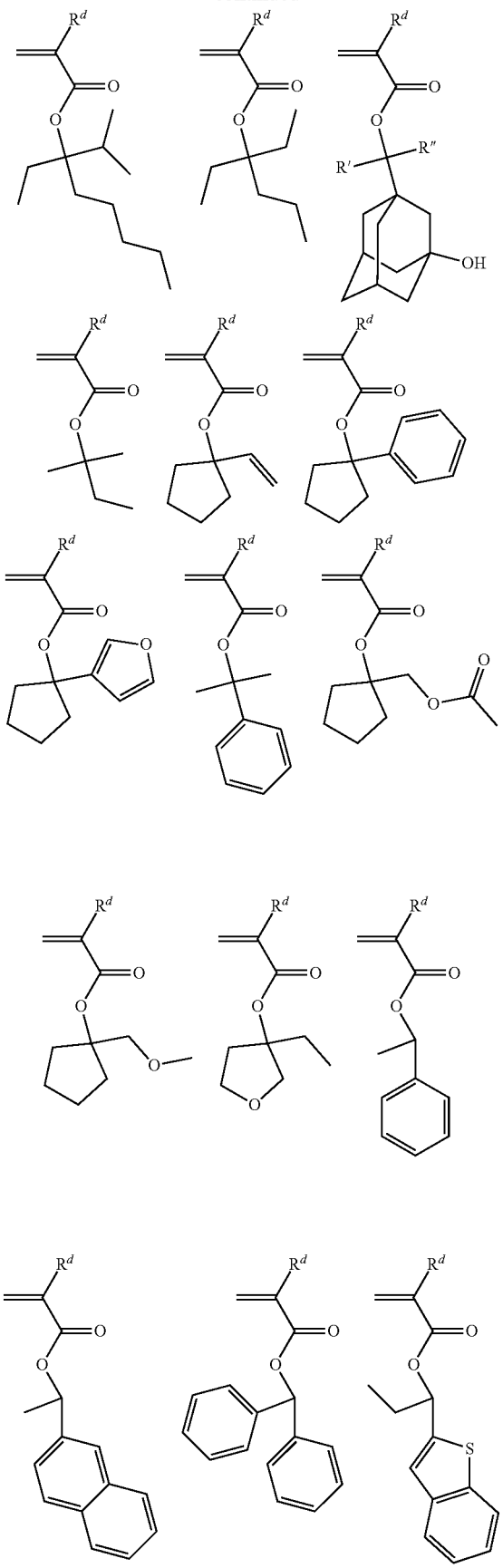

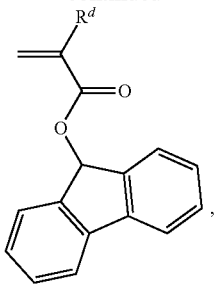

wherein $R^d$ is as defined above; and R' and R" are each independently a straight chain or branched $C_{1-20}$ alkyl, a monocyclic or polycyclic $C_{3-20}$ cycloalkyl, a monocyclic or polycyclic $C_{1-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted.

Non-limiting examples of monomers of formula (4c) include:

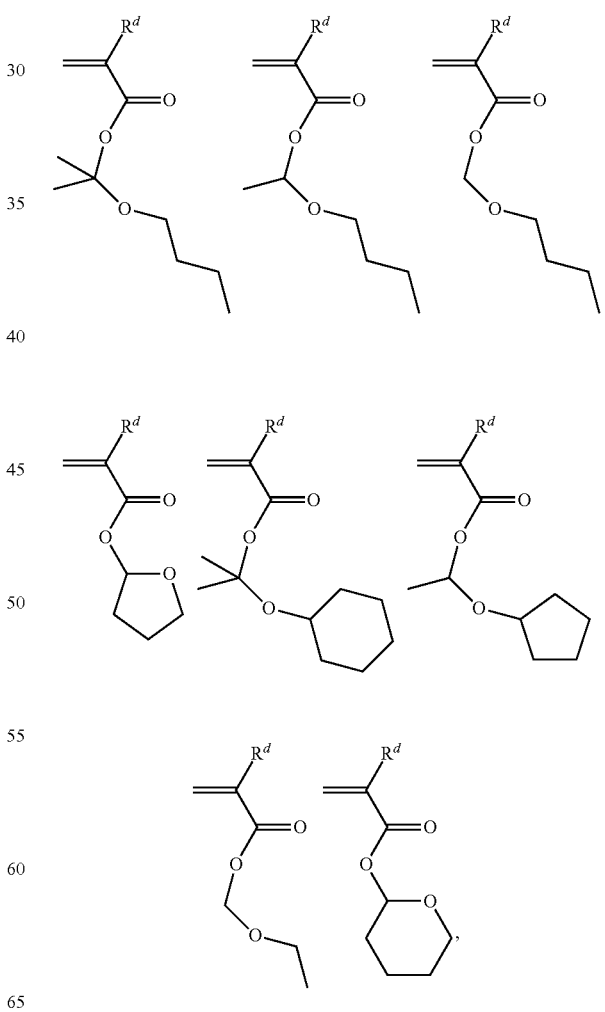

wherein $R^d$ is as defined above.

Non-limiting examples of monomers (4d) include:
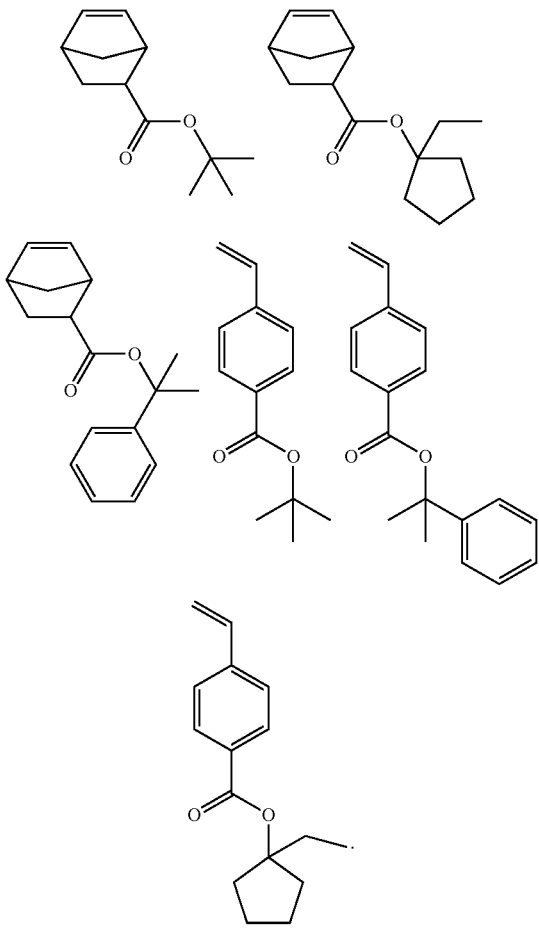
Non-limiting examples of monomers (4e) include:
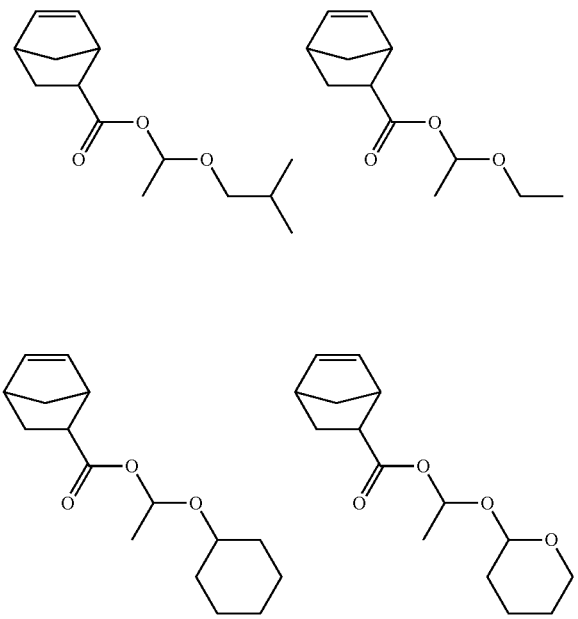
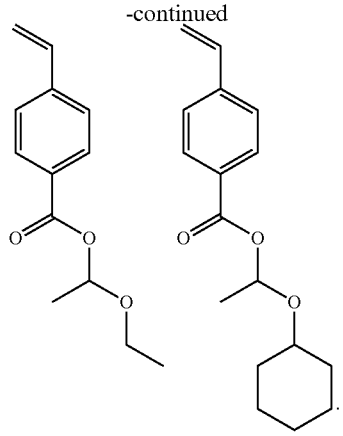
In still another example, the repeating unit having an acid-labile group of the polymer may be derived from one or more monomers having a cyclic acetal or cyclic ketal group, for example, of the formulas:
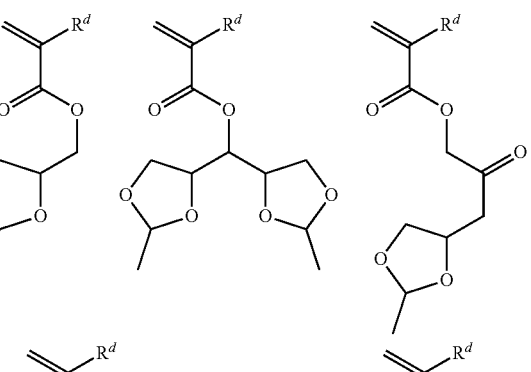
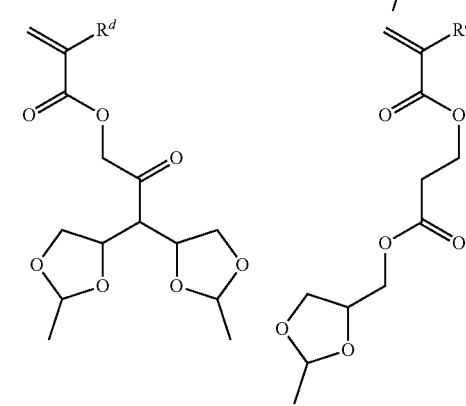
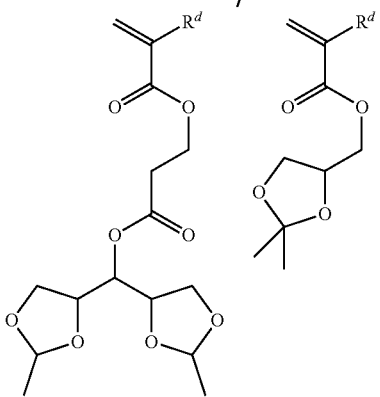

-continued

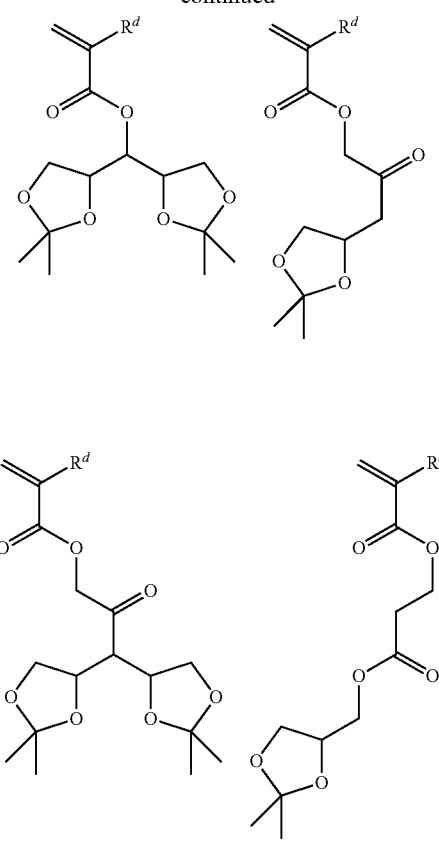

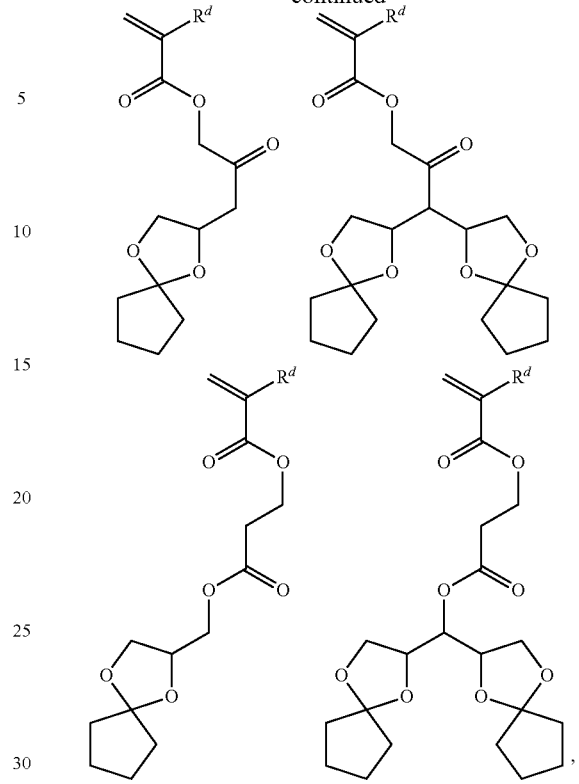

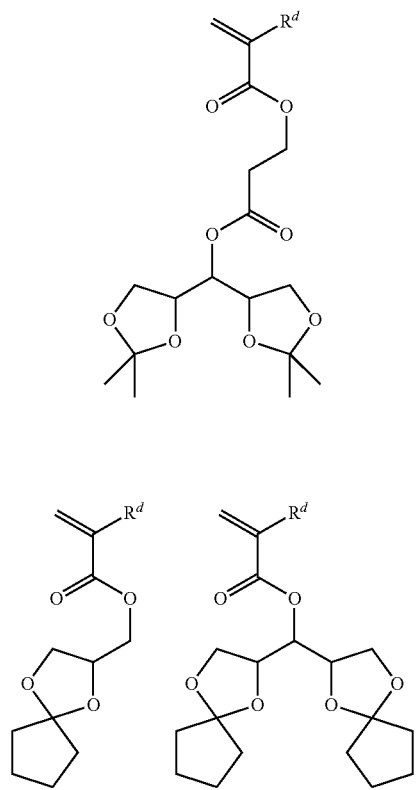

wherein $R^d$ is as defined above.

In still another example, the repeating unit having an acid-labile group of the polymer may be derived from one or more monomers having a tertiary alkoxy group, for example, of the formulas:

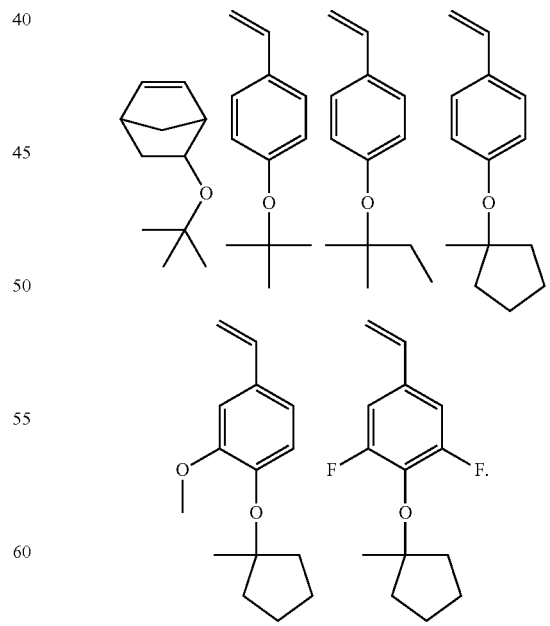

The repeating unit having an acid-labile group is typically present in the acid-sensitive polymer in an amount from 10 to 80 mol %, more typically from 25 to 75 mol %, still more typically from 30 to 70 mol %, based on total repeating units in the acid-sensitive polymer.

In some aspects, the acid-sensitive polymer may include a repeating unit having an aromatic group, wherein the aromatic group may be substituted or unsubstituted. The aromatic group is a monocyclic or polycyclic $C_{5-60}$ aromatic group optionally comprising one or more aromatic ring heteroatoms chosen from N, O, S, or a combination thereof. When the $C_{5-60}$ aromatic group is polycyclic, the ring or ring groups may be fused (such as naphthyl or the like), directly linked (such as biaryls, biphenyl, or the like), bridged by a heteroatom (such as triphenylamino or diphenylene ether), and/or may include a combination of fused and directly linked rings (such as binaphthyl or the like).

The monocyclic or polycyclic $C_{5-60}$ aromatic group can be substituted or unsubstituted. Exemplary substituents include, but are not limited to, substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, —$OR^{51}$, —$SR^{52}$, or —$NR^{53}R^{54}$, wherein $R^{51}$ to $R^{54}$ are each independently hydrogen, or substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl. Preferably, the aromatic group is a substituted $C_{6-30}$ aryl group or a substituted $C_{7-30}$ heteroaryl group, wherein the aromatic group is substituted with a heteroatom-containing substituent group, such as —$OR^{51}$, —$SR^{52}$, or —$NR^{53}R^{54}$, wherein $R^{51}$ to $R^{54}$ are each independently hydrogen, or substituted or unsubstituted $C_{1-10}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

The repeating unit having the aromatic group is typically present in the acid-sensitive polymer in an amount from 5 to 80 mol %, more typically from 10 to 50 mol %, still more typically from 10 to 40 mol %, based on total repeating units in the acid-sensitive polymer.

The acid-sensitive polymer may include a lactone repeating unit derived from a monomer of formula (5):

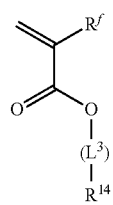

(5)

In formula (5), $R^f$ is hydrogen, fluorine, cyano, a substituted or unsubstituted $C_{1-10}$ alkyl, or a substituted or unsubstituted $C_{1-10}$ fluoroalkyl. Preferably, $R^f$ is hydrogen, fluorine, or substituted or unsubstituted $C_{1-5}$ alkyl, typically methyl. $L^3$ may be a single bond or a divalent linking group comprising one or more of substituted or unsubstituted $C_{1-30}$ alkylene, substituted or unsubstituted $C_{1-30}$ heteroalkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{7-30}$ arylalkylene, or substituted or unsubstituted $C_{1-30}$ heteroarylene, or substituted or unsubstituted $C_{3-30}$ heteroarylalkylene, wherein $L^3$ optionally may further include one or more groups chosen, for example, from —O—, —C(O)—, —C(O)—O—, —S—, —S(O)$_2$—, and —N($R^{44}$)—S(O)$_2$—, wherein $R^{44}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. $R^{14}$ may be a monocyclic, polycyclic, or fused polycyclic $C_{4-20}$ lactone-containing group.

Non-limiting examples of monomers of formula (5) include:

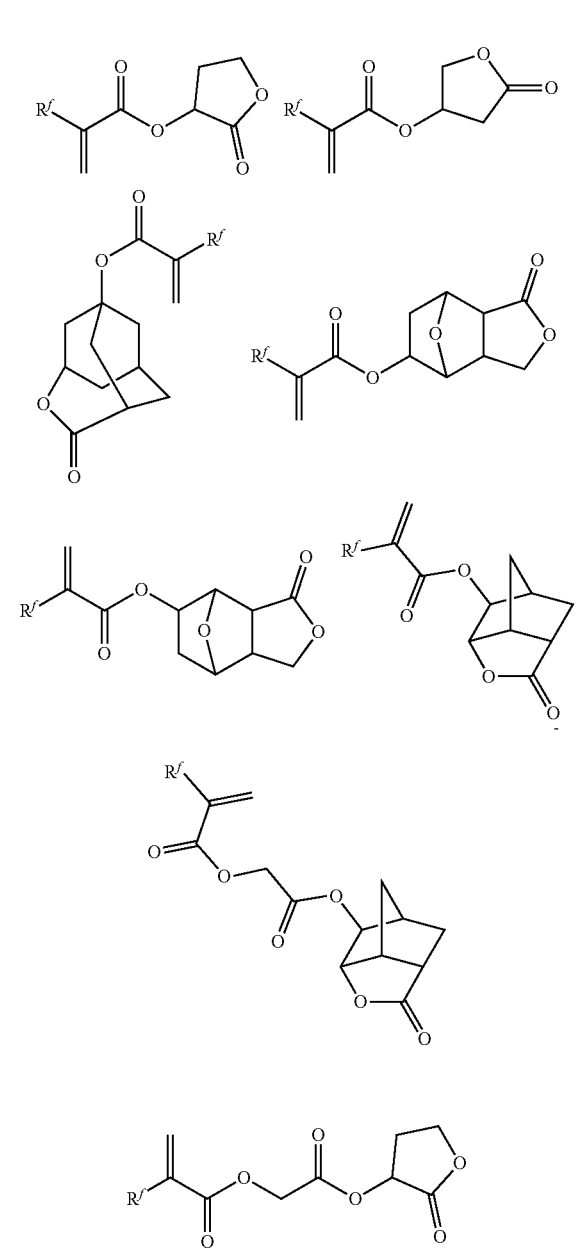

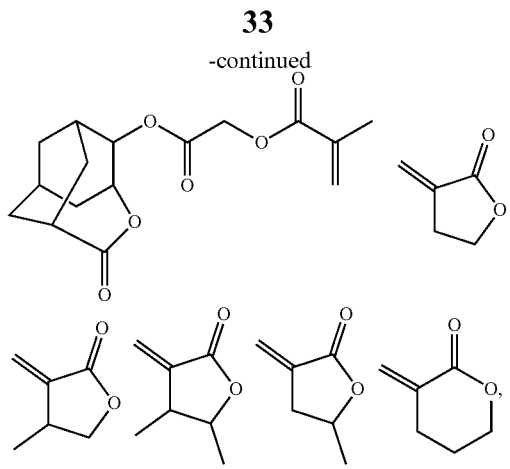

wherein $R^f$ is as disclosed herein.

When present, the acid-sensitive polymer typically comprises a lactone repeating unit in an amount from 5 to 60 mol %, typically 20 to 55 mol %, more typically 25 to 50 mol % based on total repeating units in the acid-sensitive polymer.

The acid-sensitive polymer may include a base-soluble repeating unit having a pKa of less than or equal to 12. For example, the base-soluble repeating unit can be derived from a monomer of formula (6):

(6)

In formula (6), $R^g$ may be hydrogen, fluorine, cyano, a substituted or unsubstituted $C_{1-10}$ alkyl, or a substituted or unsubstituted $C_{1-10}$ fluoroalkyl. Preferably, $R^g$ is hydrogen, fluorine, or substituted or unsubstituted $C_{1-5}$ alkyl, typically methyl. $Q^4$ may be one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or —C(O)—O—. W is a base-soluble group and can be chosen, for example, from hydroxyl (—OH); —C(O)—OH; a fluorinated alcohol such as —C(CF$_3$)$_2$OH; an amide; an imide; or —NH—S(O)$_2$—Y$^1$ where Y$^1$ is F or $C_{1-4}$ perfluoroalkyl. In formula (6), a is an integer of 1 to 3.

Non-limiting examples of monomers of formula (6) include:

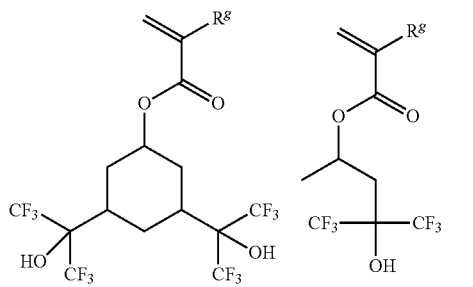

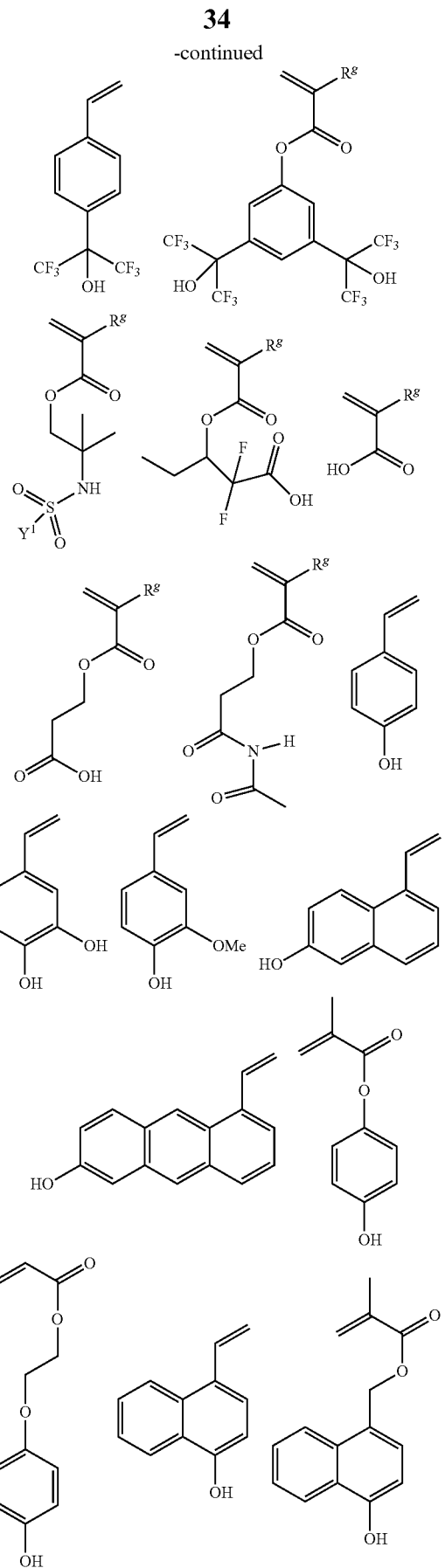

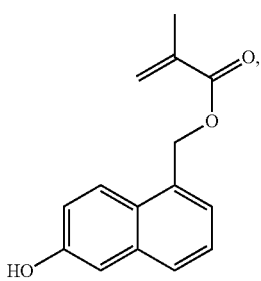

wherein $R^g$ and $Y^1$ are as described above.

Other base-soluble groups can be N-hydroxyaryl maleimides of the structure:

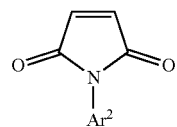

wherein $Ar^2$ is a hydroxy-substituted $C_{6-60}$ aryl group, a hydroxy-substituted $C_{4-60}$ heteroaryl group, or a combination thereof, optionally further substituted with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, $C_{3-30}$ alkylheteroaryl, $-OR^{21}$, $-NH_2$, $-NHR^{22}$, or $-NR^{23}R^{24}$, wherein $R^{21}$ to $R^{24}$ are each independently substituted or unsubstituted $C_{1-30}$ alkyl, substituted or unsubstituted $C_{3-30}$ cycloalkyl, substituted or unsubstituted $C_{1-30}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl. It may be desired for $Ar^2$ to comprise a single hydroxyl group or a plurality of hydroxyl groups (e.g., $Ar^2$ may be a hydroxy-substituted $C_{6-60}$ aryl group, a hydroxy-substituted $C_{4-60}$ heteroaryl group, or a combination thereof, each of which is independently optionally further substituted with a hydroxyl group). Non-limiting examples of monomers include the following:

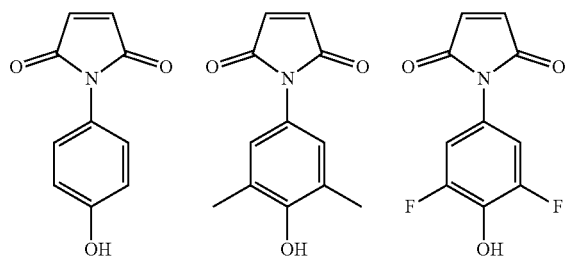

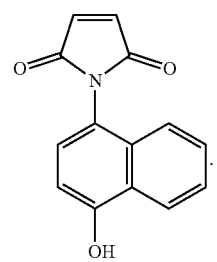

When present, the base-soluble repeating unit may be present in the acid-sensitive polymer typically in an amount from 2 to 75 mol %, typically 5 to 25 mol %, more typically 5 to 15 mol % based on total repeating units in the acid-sensitive polymer.

Non-limiting examples of the acid-sensitive polymer include the following:

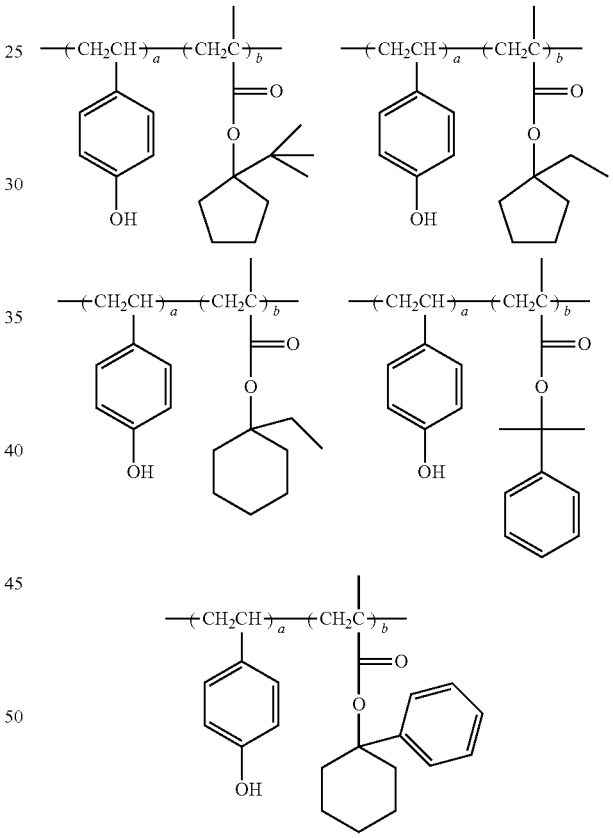

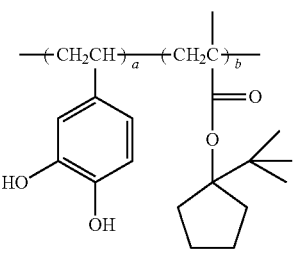

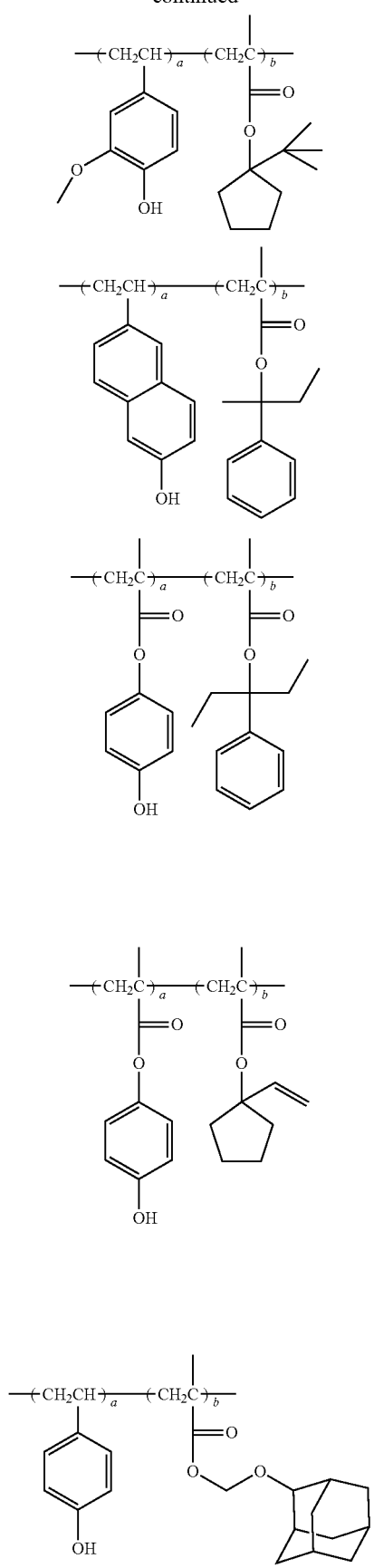
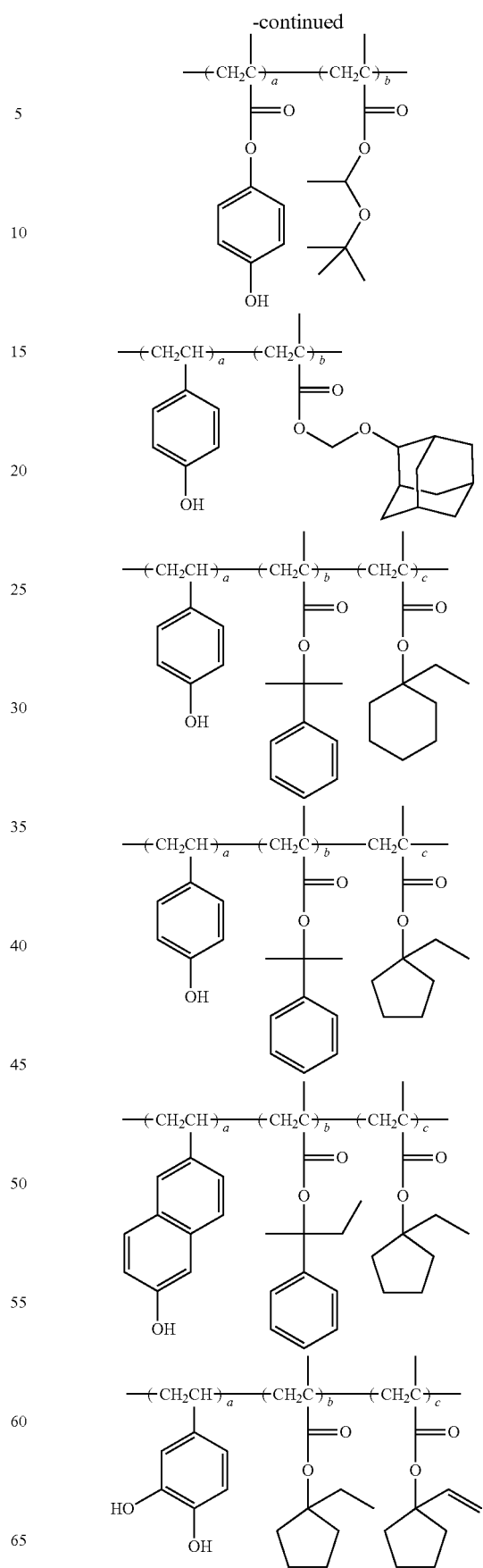

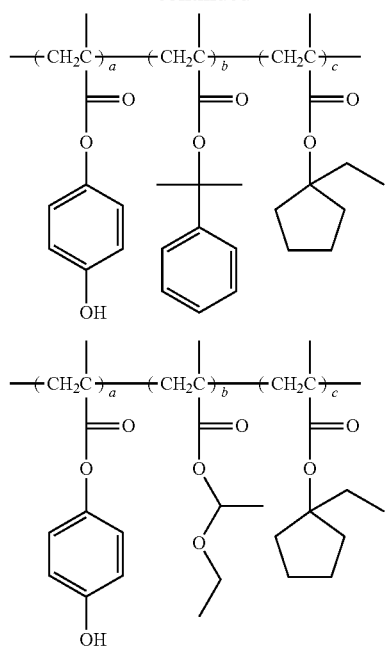
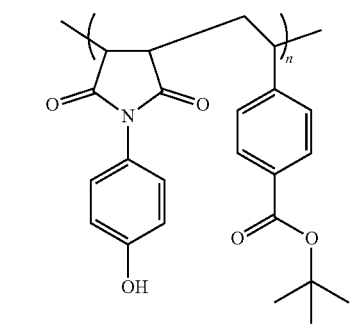
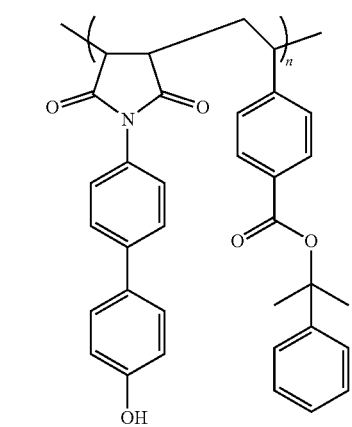
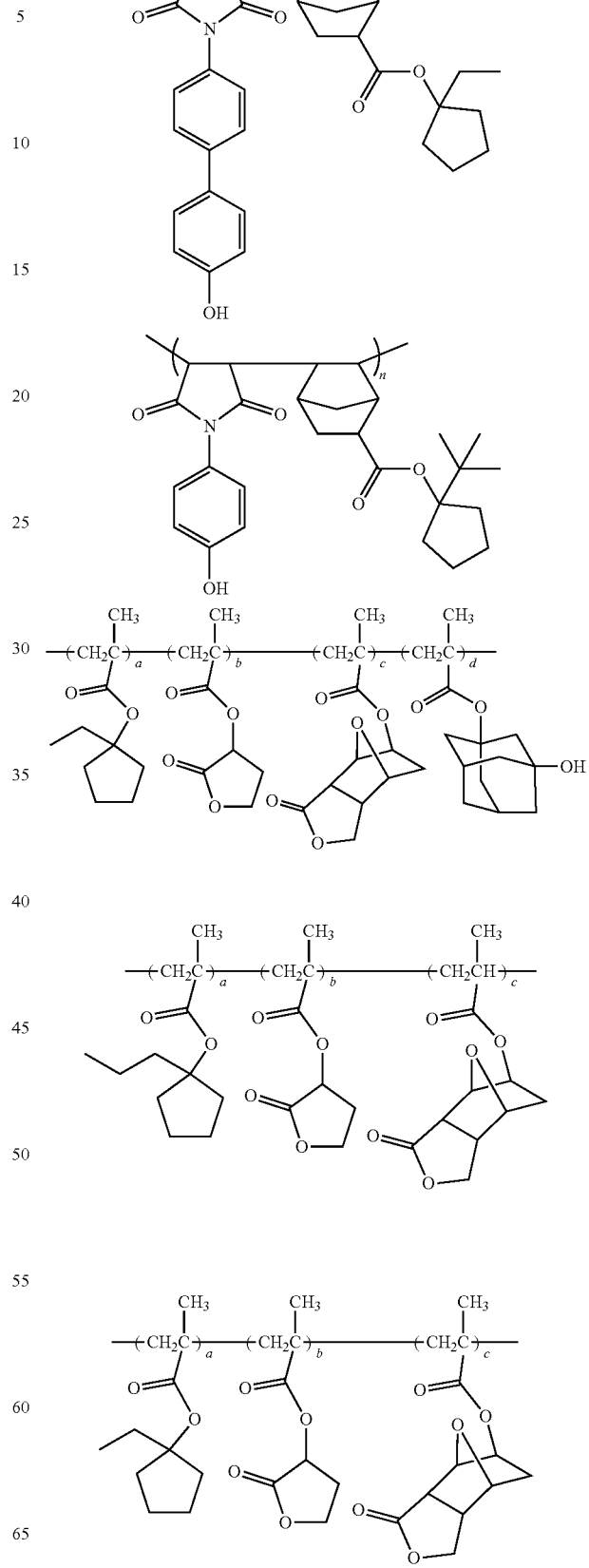

-continued
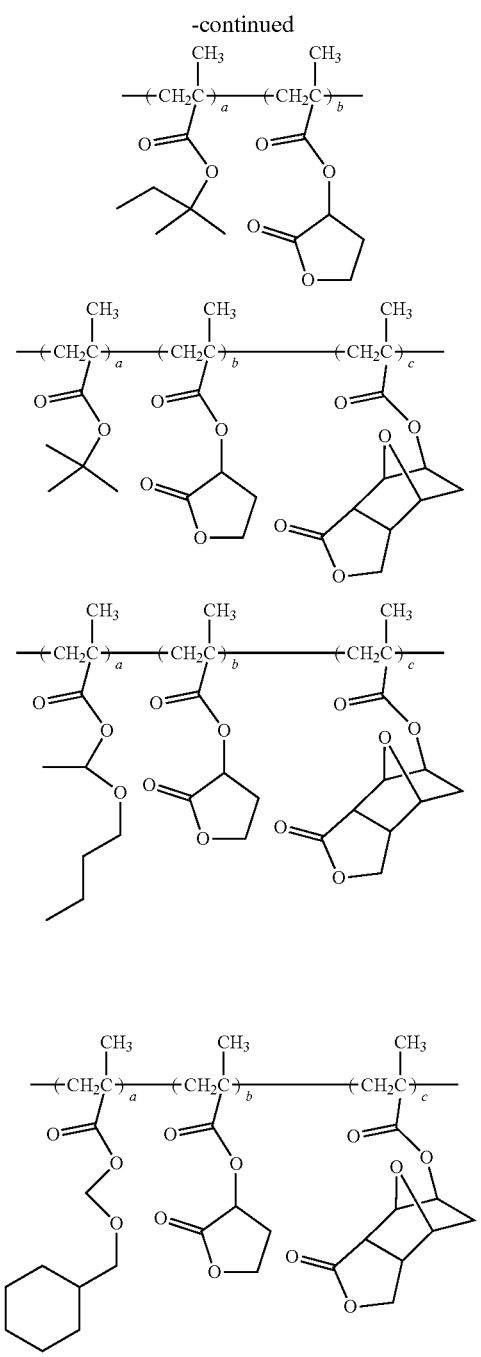
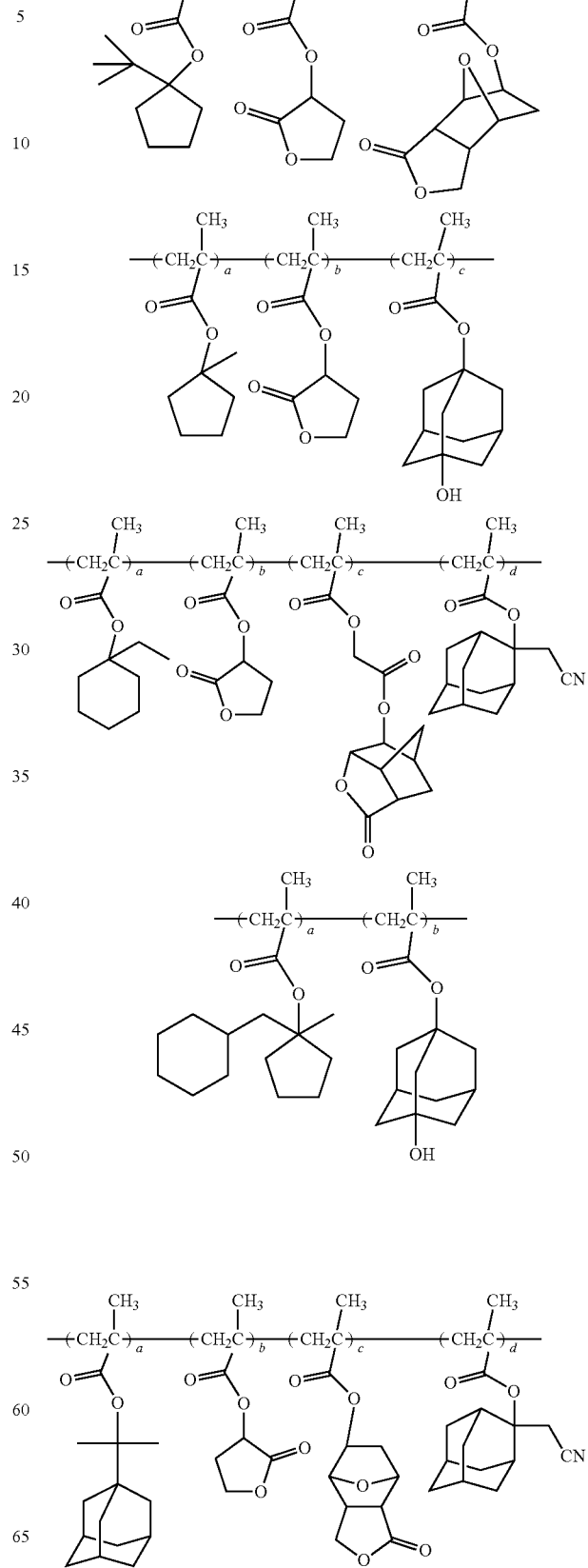

-continued
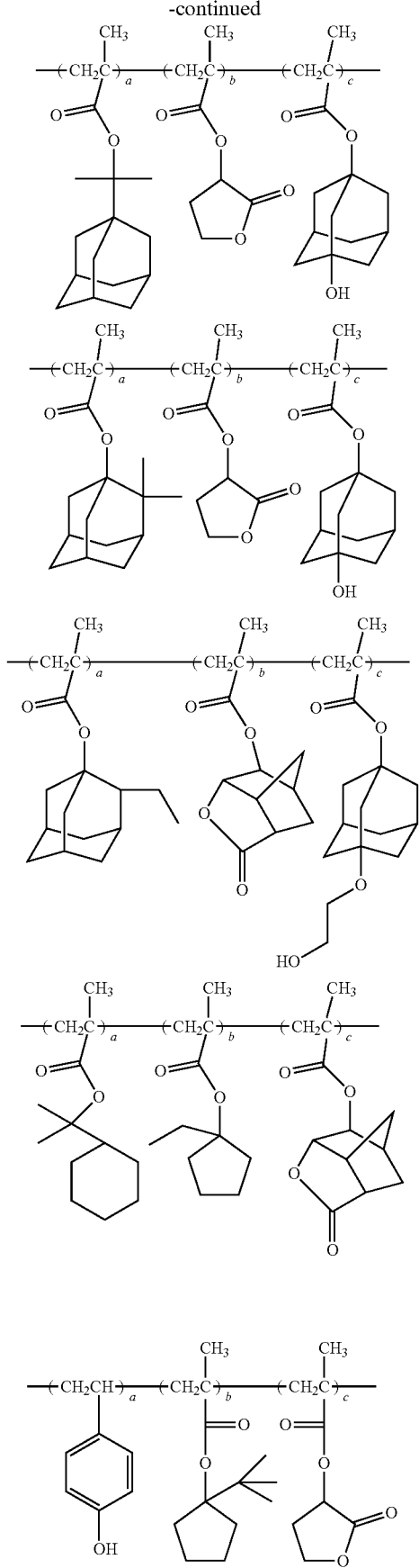
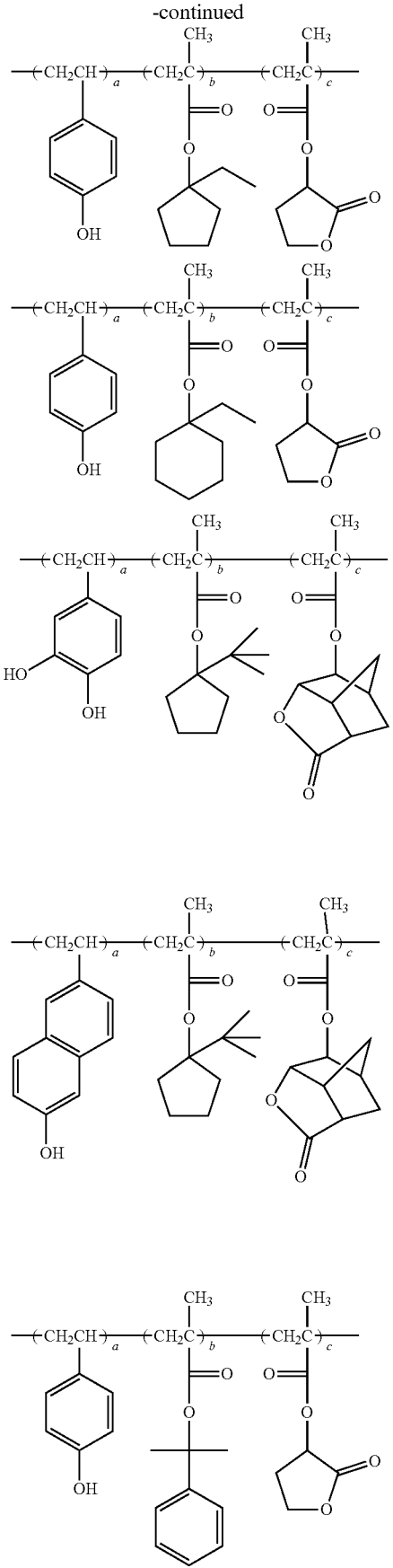

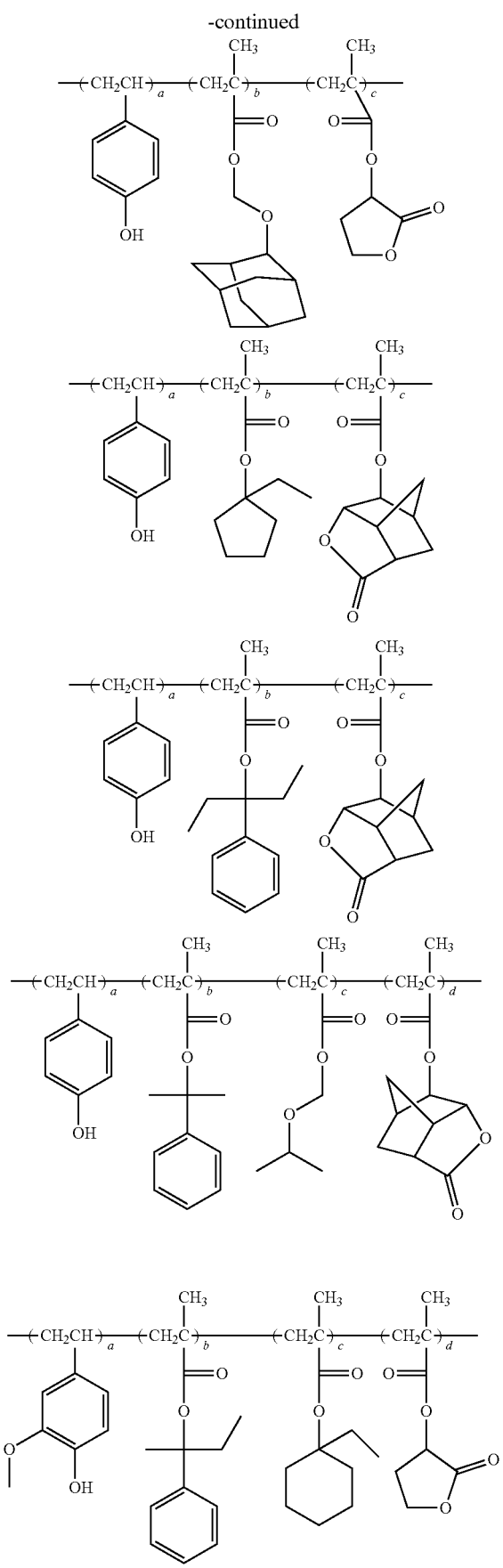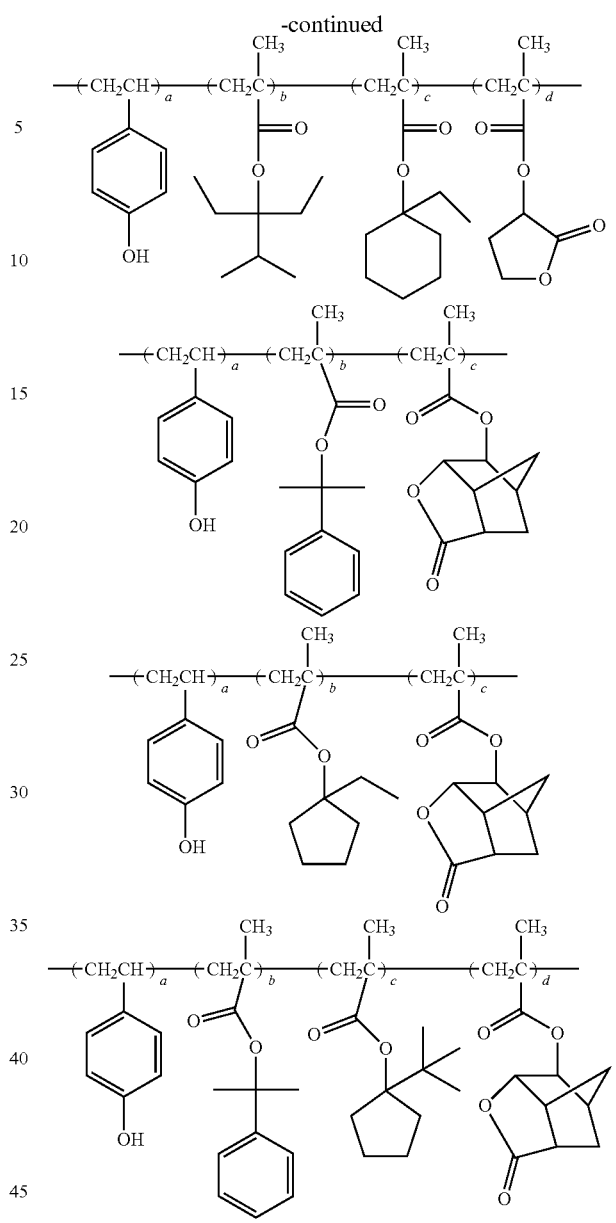

wherein a, b, c, and d represent mole fractions of the corresponding repeating units, and n is an integer from 10 to 1,000.

The acid-sensitive polymer may optionally include one or more additional repeating units. The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the acid-sensitive polymer, may be used in an amount of up to 70 mol %, typically from 3 to 50 mol %, based on total repeating units of the acid-sensitive polymer.

The acid-sensitive polymer typically has a weight average molecular weight ($M_w$) of 1,000 to 50,000 Daltons (Da), specifically 2,000 to 30,000 Da, more specifically 3,000 to 20,000 Da, still more specifically 3,000 to 10,000 Da. The polydispersity index (PDI) of the acid-sensitive polymer, which is the ratio of $M_w$ to number average molecular weight ($M_n$) is typically 1.1 to 3, specifically 1.1 to 2. Molecular weight values are determined by gel permeation chromatography (GPC) using polystyrene standards.

The photoresist compositions may further include a PAG compound in addition to the iodonium salt compound. The additional PAG compound typically has a pKa from −15 to 1. The PAG can be in non-polymeric form or in polymeric form, for example, present in a polymerized repeating unit of the acid-sensitive polymer as described above, or as part of a different polymer. Suitable non-polymeric photoacid generator compounds may have formula $G^+A^-$, wherein $G^+$ is an organic cation chosen from iodonium cations substituted with two alkyl groups, two aryl groups, or a combination of alkyl and aryl groups; and sulfonium cations substituted with three alkyl groups, three aryl groups, or a combination of alkyl and aryl groups, and $A^-$ is a non-polymerizable organic anion.

Particularly suitable non-polymeric organic anions include those, the conjugated acids of which have a pKa of from −15 to 1. Particularly preferred anions are fluorinated alkyl sulfonates and fluorinated sulfonimides.

Suitable non-polymeric PAG compounds are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerized photoacid generators are further described in U.S. Pat. No. 8,431,325 to Hashimoto et al. in column 37, lines 11-47 and columns 41-91. Other suitable sulfonate PAGs include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325.

Typically, when the photoresist composition includes the non-polymeric photoacid generator, it is present in the photoresist composition in an amount of from 2 to 65 wt %, more typically 5 to 55 wt %, based on total solids of the photoresist composition.

In other aspects, the acid-sensitive polymer or a different polymer optionally may comprise a repeating unit comprising a PAG repeat unit derived from formula (7):

In formula (7), $R^h$ is hydrogen, fluorine, cyano, a substituted or unsubstituted $C_{1-10}$ alkyl, or a substituted or unsubstituted $C_{1-10}$ fluoroalkyl. Preferably, $R^h$ is hydrogen, fluorine, or substituted or unsubstituted $C_{1-5}$ alkyl, typically methyl. $Q^5$ is a single bond or a divalent linking group chosen from one or more of a heteroatom, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or a combination thereof. Preferably, $Q^5$ may include 1 to 10 carbon atoms and at least one heteroatom, more preferably —C(O)—O—.

In formula (7), $A^4$ is one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl. Preferably, $A^4$ is a divalent $C_{1-30}$ perfluoroalkyl group that is optionally substituted.

In formula (7), $Z^-$ is an anionic moiety, the conjugated acid of which typically has a pKa from −15 to 1. Particularly preferred such anions are fluorinated alkyl sulfonates and fluorinated sulfonimides.

In formula (7), $G^+$ is an organic cation chosen from iodonium cations substituted with two alkyl groups, two aryl groups, or a combination of alkyl and aryl groups; and sulfonium cations substituted with three alkyl groups, three aryl groups, or a combination of alkyl and aryl groups. In some embodiments, $G^+$ is an iodonium cation substituted with two alkyl groups, two aryl groups, or a combination of alkyl and aryl groups; or a sulfonium cation substituted with three alkyl groups, three aryl groups, or a combination of alkyl and aryl groups. Preferably, the photoacid generator includes a sulfonium cation.

Exemplary monomers of formula (7) include the following:

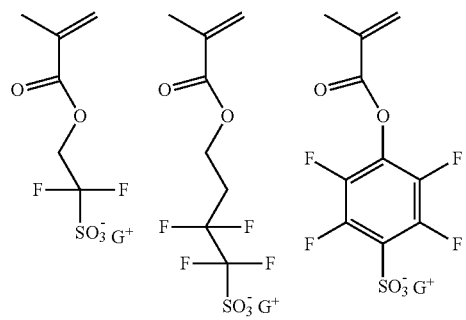

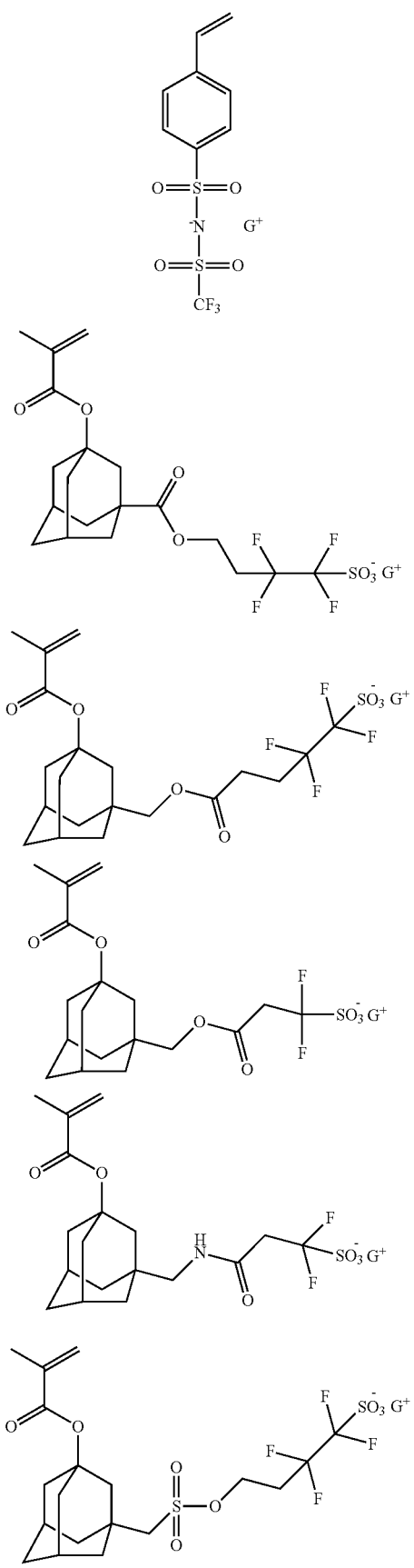

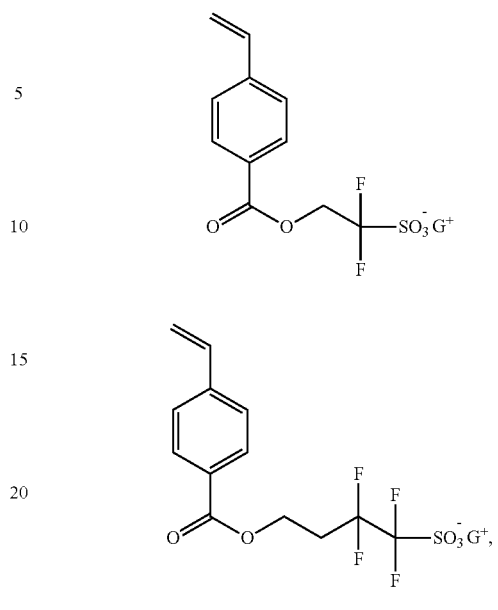

wherein G⁺ is an organic cation.

In some embodiments, G⁺ is a sulfonium cation having the formula (8A) or an iodonium cation having the formula (8B):

(8A)

(8B)

wherein, each $R^{aa}$ is independently a $C_{1-20}$ alkyl group, a $C_{1-20}$ fluoroalkyl group, a $C_{3-20}$ cycloalkyl group, a $C_{3-20}$ fluorocycloalkyl group, a $C_{2-20}$ alkenyl group, a $C_{2-20}$ fluoroalkenyl group, a $C_{6-30}$ aryl group, a $C_{6-30}$ fluoroaryl group, $C_{6-30}$ iodoaryl group, a $C_{1-30}$ heteroaryl group, a $C_{7-20}$ arylalkyl group, a $C_{7-20}$ fluoroarylalkyl group, a $C_{2-20}$ heteroarylalkyl group, or a $C_{2-20}$ fluoroheteroarylalkyl group, each of which is substituted or unsubstituted, wherein each $R^{aa}$ is either separate or connected to another group $R^{aa}$ via a single bond or a divalent linking group to form a ring. Each $R^{aa}$ optionally may include as part of its structure one or more groups chosen from —O—, —C(O)—, —C(O)—O—, —$C_{1-12}$ hydrocarbylene-, —O—($C_{1-12}$ hydrocarbylene)-, —C(O)—O—($C_{1-12}$ hydrocarbylene)-, and —C(O)—O—($C_{1-12}$ hydrocarbylene)-O—. Each $R^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of $R^{aa}$ groups include, for example, —O—, —S—, —Te—, —Se—, —C(O)—, —C(S)—, —C(Te)—, or —C(Se)—, substituted or unsubstituted $C_{1-5}$ alkylene, and combinations thereof.

Exemplary sulfonium cations of formula (8A) include the following:
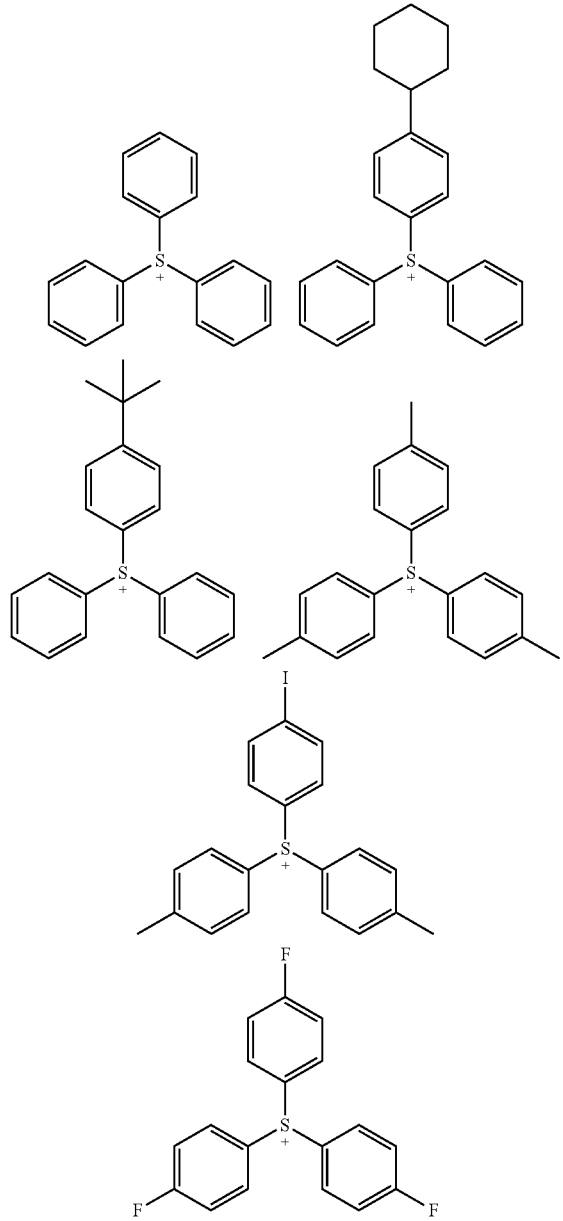
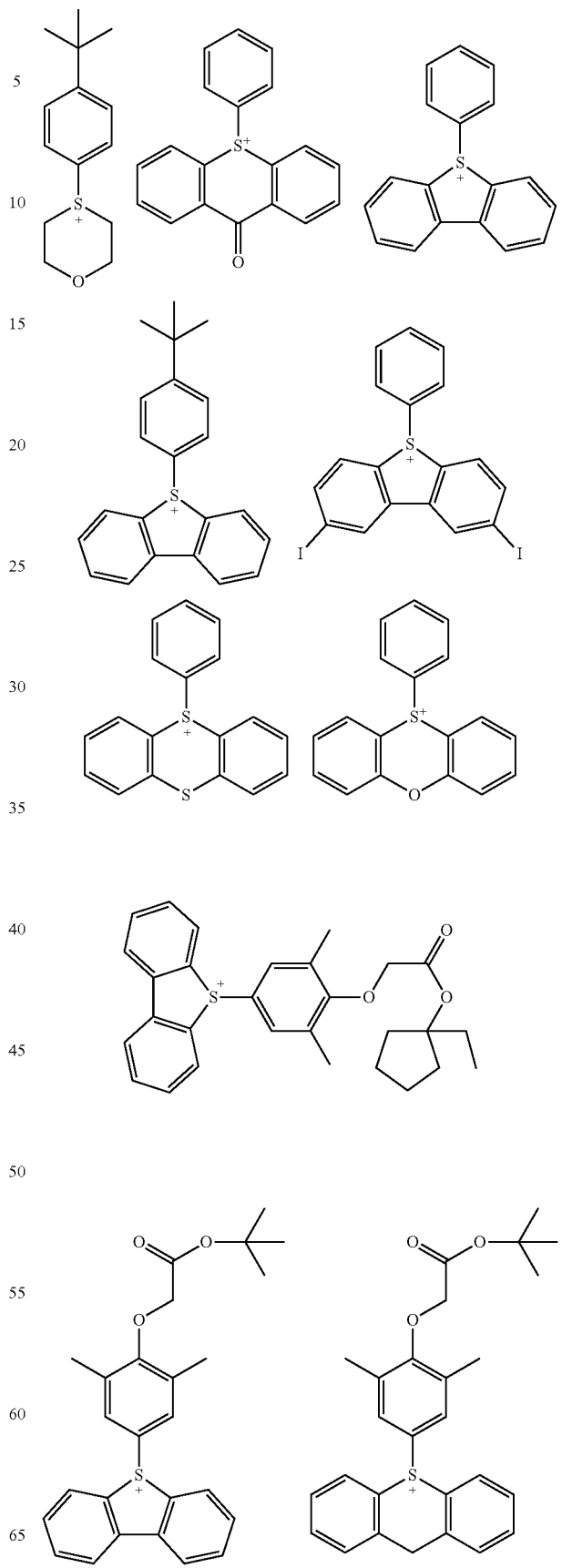

-continued
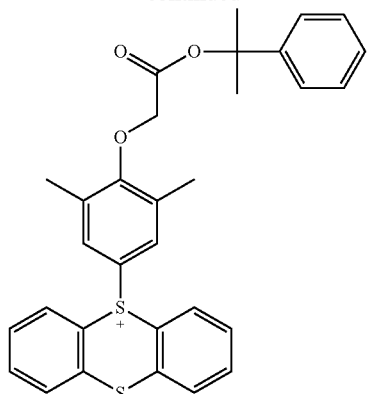
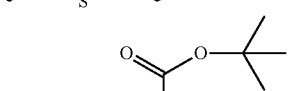
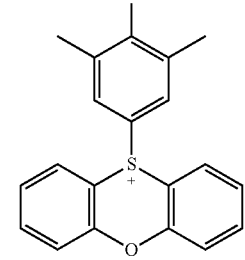
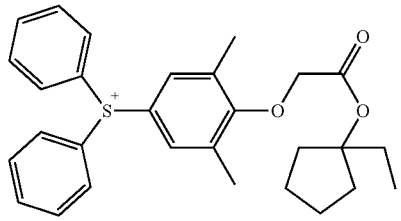
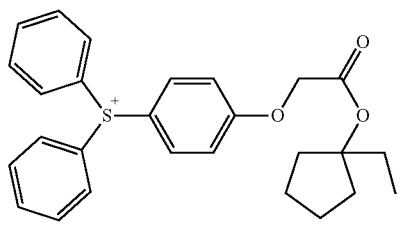
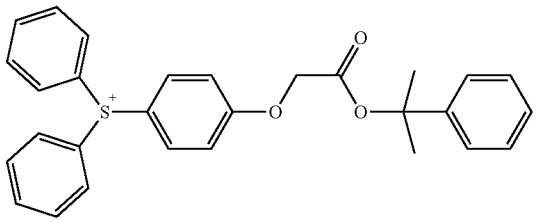
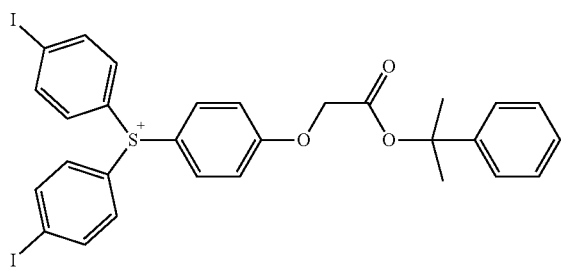
-continued
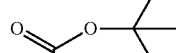
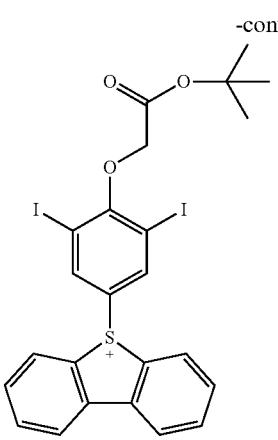
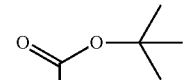
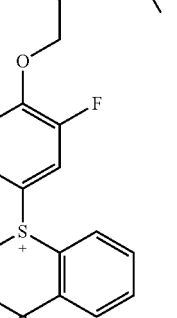
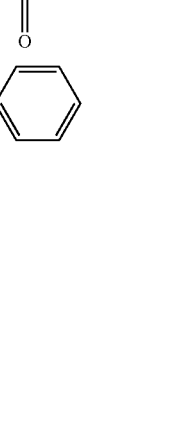
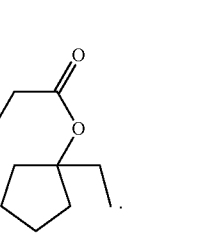
Exemplary iodonium cations of formula (8B) include the following:
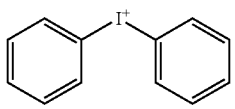

-continued

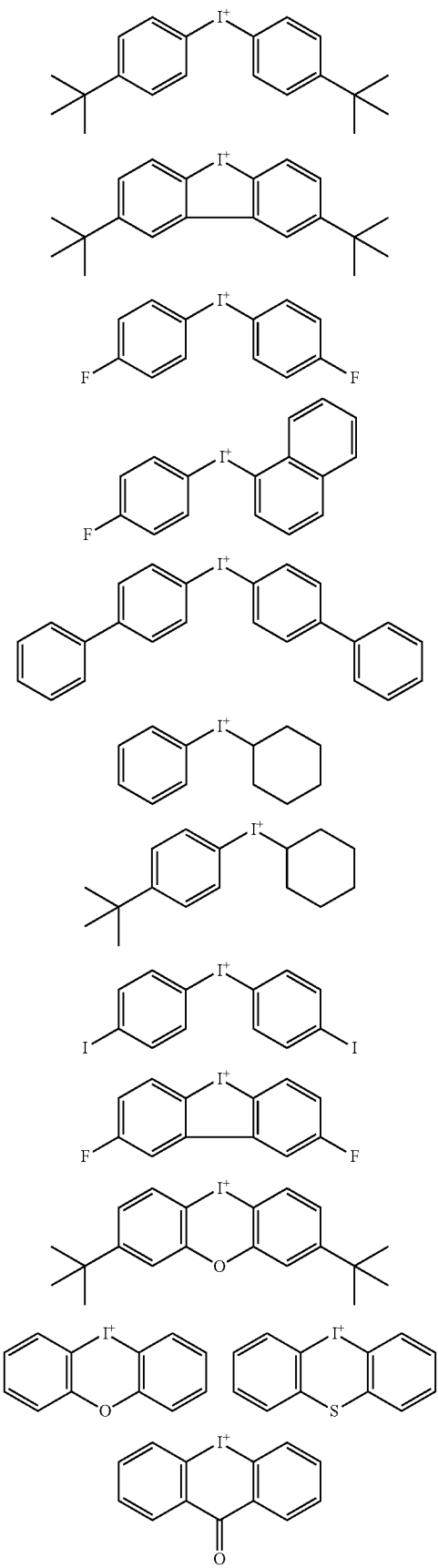

-continued

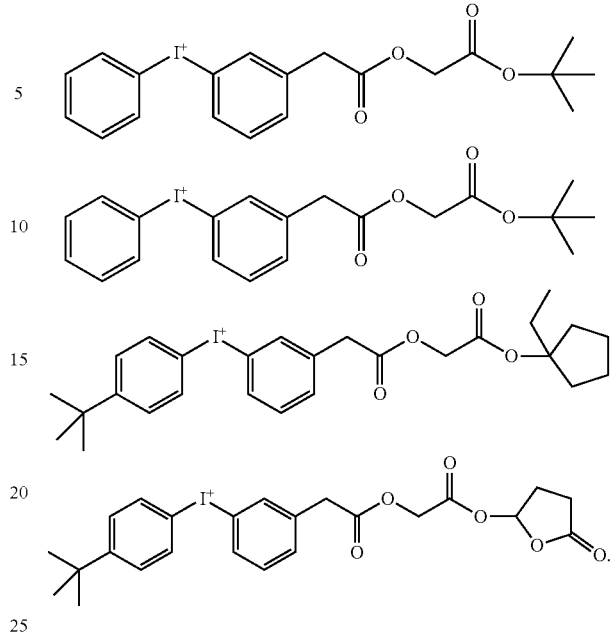

The polymer and/or the acid-sensitive polymer may optionally comprise a repeating unit comprising a PAG that is derived from a monomer of formula (5), as disclosed above. The polymer and/or acid-sensitive polymer may include a repeating unit comprising a photoacid generator in an amount of 1 to 15 mol %, typically 1 to 8 mol %, more typically 2 to 6 mol %, based on total repeating units in the polymer and/or acid labile polymer.

In the photoresist compositions of the invention, the acid-sensitive polymer is typically present in the photoresist composition in an amount of from 0.5 to 99.9 wt %, typically from 1 to 15 wt %, more typically 1 to 10 wt %, based on total solids of the photoresist composition. It will be understood that total solids includes the polymers, PAGs, and other non-solvent components.

In some aspects, the photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that preferably 1%, of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used to develop the resist pattern using a single puddle development or dynamic development process, e.g., where the 0.26 N TMAH developer is dispensed onto an imaged photoresist layer for a suitable time such as 10 to 120 seconds (s). An exemplary base-labile group is an ester group, typically a fluorinated ester group. Preferably, the base-labile material is substantially not miscible with and has a lower surface energy than the first and second polymers, and other solid components of the photoresist composition. When coated on a substrate, the base-labile material can thereby segregate from other solid components of the photoresist composition to the top surface of the formed photoresist layer.

In some aspects, the base-labile material is a polymeric material, also referred to herein as a base-labile polymer, which may include one or more repeating units comprising one or more base-labile groups. For example, the base-labile polymer may comprise a repeating unit comprising 2 or more base-labile groups that are the same or different. A preferred base-labile polymer comprises at least one repeating unit comprising 2 or more base-labile groups, for example a repeating unit comprising 2 or 3 base-labile groups.

The base-labile polymer may be a polymer comprising a repeating unit derived from a monomer of formula (E1)

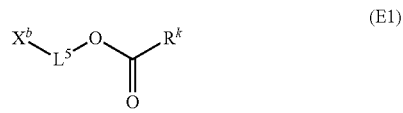
(E1)

wherein $X^b$ is a polymerizable group selected from vinyl and acrylic, $L^5$ is a divalent linking group comprising one or more of substituted or unsubstituted linear or branched $C_{1-20}$ alkylene, substituted or unsubstituted $C_{3-20}$ cycloalkylene, —C(O)—, or —C(O)O—; and $R^k$ is a substituted or unsubstituted $C_{1-20}$ fluoroalkyl group provided that the carbon atom bonded to the carbonyl (C=O) in formula (E1) is substituted with at least one fluorine atom.

Exemplary monomers of formula (E1) include the following:

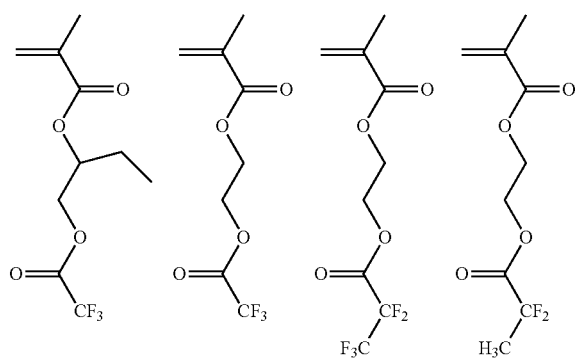

The base-labile polymer may include a repeating unit including two or more base-labile groups. For example, the base-labile polymer can include a repeating unit derived from a monomer of formula (E2)

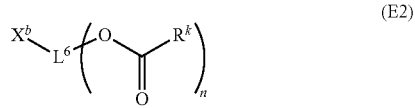
(E2)

wherein $X^b$ and $R^k$ are as defined in formula (E1); $L^6$ is a polyvalent linking group comprising one or more of substituted or unsubstituted straight chain or branched $C_{1-20}$ alkylene, substituted or unsubstituted $C_{3-20}$ cycloalkylene, —C(O)—, or —C(O)O—; and n is an integer of 2 or more, for example 2 or 3.

Exemplary monomers of formula (E2) include the following:

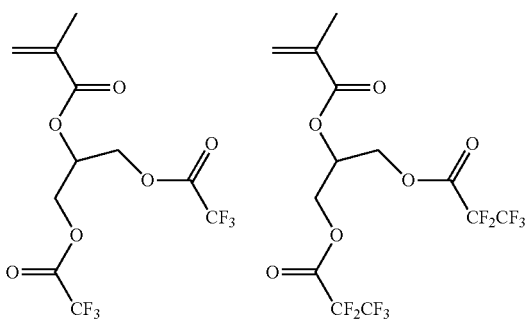

The base-labile polymer may include a repeating unit including one or more base-labile groups. For example, the base-labile polymer can include a repeating unit derived from a monomer of formula (E3):

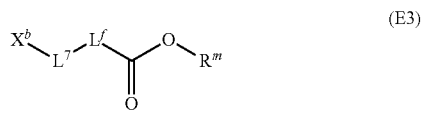
(E3)

wherein $X^b$ is as defined in formula (E1); $L^7$ is a divalent linking group comprising one or more of substituted or unsubstituted straight chain or branched $C_{1-20}$ alkylene, substituted or unsubstituted $C_{3-20}$ cycloalkylene, —C(O)—, or —C(O)O—; $L^f$ is a substituted or unsubstituted $C_{1-20}$ fluoroalkylene group wherein the carbon atom bonded to the carbonyl (C=O) in formula (E1) is substituted with at least one fluorine atom; and $R^m$ is substituted or unsubstituted straight chain or branched $C_{1-20}$ alkyl, or substituted or unsubstituted $C_{3-20}$ cycloalkyl.

Exemplary monomers of formula (E3) include the following:

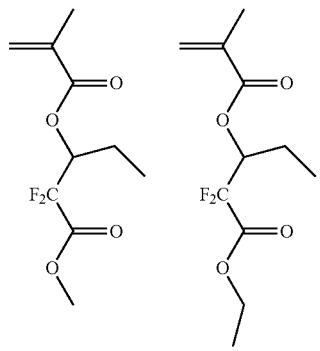 [SMILES: C=C(C)C(=O)OC(CC)C(F)(F)C(=O)OC ; C=C(C)C(=O)OC(CC)C(F)(F)C(=O)OCC]

In a further preferred aspect of the invention, a base-labile polymer may comprise one or more base-labile groups and one or more acid-labile groups, such as one or more acid-labile ester moieties (e.g. t-butyl ester) or acid-labile acetal groups. For example, the base-labile polymer may comprise a repeating unit including a base-labile group and an acid-labile group, i.e., wherein both a base-labile group and an acid-labile group are present on the same repeating unit. In another example, the base-labile polymer may comprise a first repeating unit comprising a base-labile group and a second repeating unit comprising an acid-labile group. Preferred photoresists of the invention can exhibit reduced defects associated with a resist relief image formed from the photoresist composition.

The base-labile polymer may be prepared using any suitable methods in the art, including those described herein for the first and second polymers. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods.

In some aspects, the base-labile material is a single molecule comprising one more base-labile ester groups, preferably one or more fluorinated ester groups. They base-labile materials that are single molecules may have a $M_w$ in the range of 50 to 1,500 Da. Exemplary base-labile materials include the following:

The photoresist compositions may further include one or more polymers in addition to and different from the polymer and acid-sensitive polymers described above. For example, the photoresist compositions may include an additional polymer as described above but different in composition, or a polymer that is similar to those described above but does not include a requisite repeating unit. Additionally, or alternatively, the one or more additional polymers may include those well known in the photoresist art, for example, those chosen from polyacrylates, polyvinylethers, polyesters, polynorbornenes, polyacetals, polyethylene glycols, polyamides, polyacrylamides, polyphenols, novolacs, styrenic polymers, polyvinyl alcohols, or combinations thereof.

The photoresist compositions further include a solvent for dissolving the components of the composition and facilitating its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol, 4-methyl-2-pentanol, and diacetone alcohol (4-hydroxy-4-methyl-2-pentanone); propylene glycol monomethyl ether (PGME); ethers such as diethyl ether, tetrahydrofuran, 1,4-dioxane and anisole; ketones such as acetone, methyl ethyl

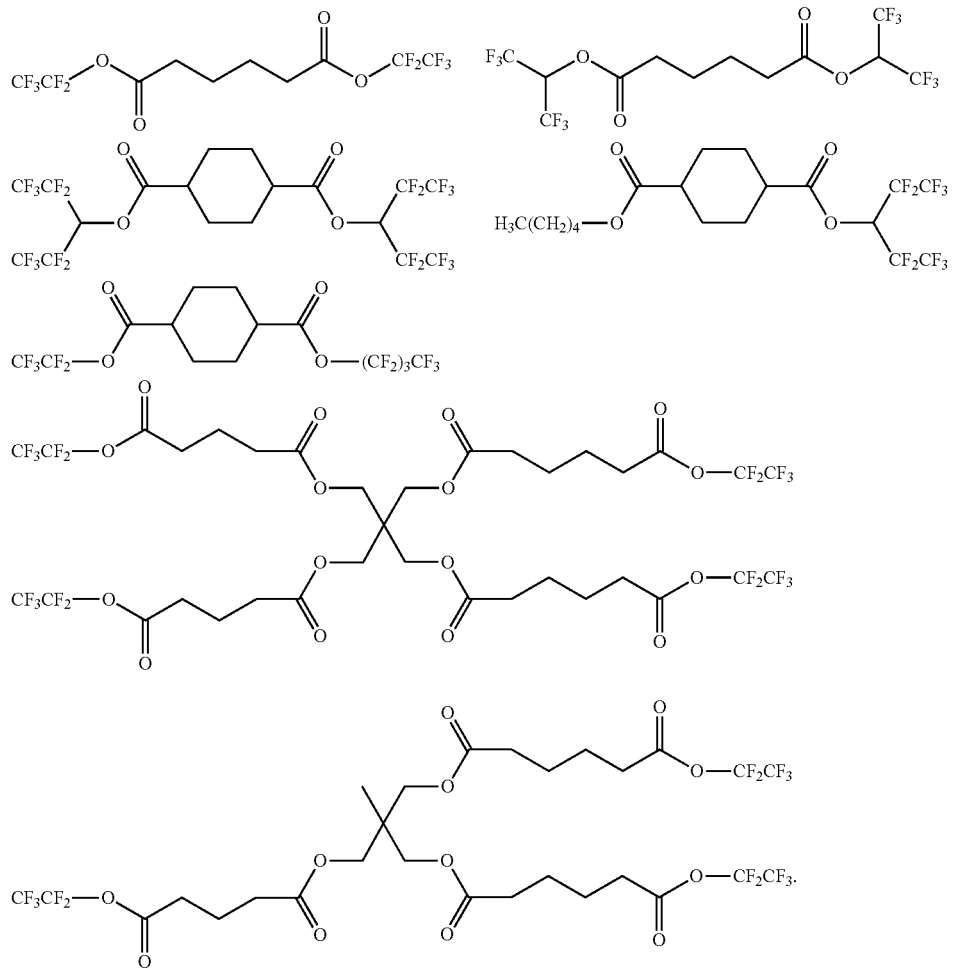

ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the photoresist compositions is typically from 40 to 99 wt %, for example, from 70 to 99 wt %, or from 85 to 99 wt %, based on total solids of the photoresist composition. The desired solvent content will depend, for example, on the desired thickness of the coated photoresist layer and coating conditions.

The photoresist composition may further include one or more additional, optional additives. For example, optional additives may include actinic and contrast dyes, anti-striation agents, plasticizers, speed enhancers, sensitizers, photo-decomposable quenchers (PDQ) (and, also known as photo-decomposable bases), basic quenchers, surfactants, and the like, or combinations thereof. If present, the optional additives are typically present in the photoresist compositions in an amount of from 0.01 to 10 wt %, based on total solids of the photoresist composition.

Photo-decomposable quenchers generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds but paired with an anion of a weak acid (pKa>1) such as, for example, a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary carboxylic acids include p-toluene sulfonic acid, camphor sulfonic acid and the like. In a preferred embodiment, the photo-decomposable quencher is a photo-decomposable organic zwitterion compound such as diphenyliodonium-2-carboxylate.

Exemplary basic quenchers include, for example: linear aliphatic amines such as tributylamine, trioctylamine, triisopropanolamine, tetrakis(2-hydroxypropyl)ethylenediamine: n-tert-butyldiethanolamine, tris(2-acetoxy-ethyl) amine, 2,2',2'',2'''-(ethane-1,2-diylbis(azanetriyl))tetraethanol, 2-(dibutylamino)ethanol, and 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; amines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

The acid-sensitive polymer and the other polymers described herein may be prepared using any suitable methods in the art. For example, one or more monomers corresponding to the repeating units described herein may be combined, or fed separately, using suitable solvent(s) and initiator, and polymerized in a reactor. For example, the polymer and acid-sensitive polymer may be obtained by polymerization of the respective monomers under any suitable conditions, such as by heating at an effective temperature, irradiation with actinic radiation at an effective wavelength, or a combination thereof.

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Mass.).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period of from 15 to 120 seconds to obtain a layer of the photoresist composition on the substrate. It will be appreciated by those skilled in the art that the thickness of the coated layer may be adjusted by changing the spin speed and/or the solids content of the composition. A photoresist layer formed from the compositions of the invention typically has a dried layer thickness of from 10 to 200 nanometers (nm), preferably from 15 to 100 nm, and more preferably from 20 to 60 nm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the particular photoresist composition and thickness. The soft bake temperature is typically from 90 to 170° C., for example, from 110 to 150° C. The soft bake time is typically from 10 seconds to 20 minutes, for example, from 1 minute to 10 minutes, or from 1 minute to 5 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation is capable of forming a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), and 13.5 nm (extreme ultraviolet, EUV) wavelengths or e-beam lithography being preferred. The methods find use in immersion or dry (non-immersion) lithography techniques. The exposure energy is typically from 1 to 200 millijoules per square centimeter (mJ/cm$^2$), preferably 10 to 100 mJ/cm$^2$ and more preferably 20 to 50 mJ/cm$^2$, dependent upon the exposure tool and components of the photoresist composition. In some aspects, the activating radiation is EUV at a wavelength of 13.5 nm.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the particular photoresist composition and layer thickness. The PEB is typically conducted at a temperature of from 80 to 150° C., and a time of from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 normal (N) TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. If the photoresist pattern is not consumed during pattern transfer, it may be removed from the substrate by known techniques, for example, oxygen plasma ashing or a wet strip process. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The invention is further illustrated by the following examples.

EXAMPLES

Synthesis Examples

The synthetic reactions were performed under normal atmospheric conditions. All chemicals were used as received from the suppliers and used without further purification.

Nuclear magnetic resonance (NMR) spectra for the compounds were obtained at 500 and 600 MHz. The chemical shifts (δ) are reported in parts per million (ppm) relative to an internal deuterated acetone or deuterated chloroform residual signal. Signal multiplicities are reported as singlet (s), doublet (d), triplet (t), multiplet (m), doublet of doublets (dd), doublet of triplets (dt), triplet of triplets (tt), or broad singlet (br), and further specify the number of atom corresponding to that signal.

Synthesis of 2-Furanyl(phenyl)iodonium tosylate (1)

A round bottom flask (RBF) equipped with a stirring bar and a rubber septum was charged with a dispersion of Koser's reagent [hydroxy(tosyloxy)iodobenzene], 1.0 g, 2.5 mmol) in 20 mL of dichloromethane (DCM). To this dispersion was added 2-furanylboronic acid (0.28 g, 2.55 mmol) and the resulting contents were stirred at room temperature (23-25° C.) for 16 hours. After 2 hours, the formation of a white precipitate was observed, and this material was confirmed to be pure compound 1. Filtration of the solid and washing with methyl tertbutyl ether (MTBE) yielded 0.7 g of the desired compound which was used in the next step without further purification.

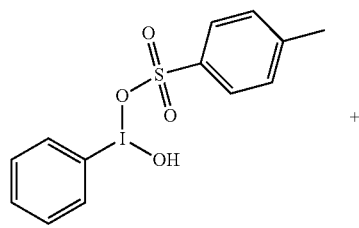

+

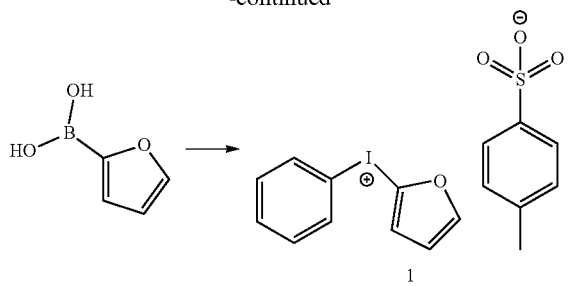

Synthesis of 2-Furanyl(phenyl)iodonium 1,1,2,2-tetrafluoro-(3-hydroxyadamantane-1-carbonyl)oxy)butane-1-sulfonate (2)

A 100 mL RBF equipped with a stirring bar and rubber septum was charged with a solution of 2-furanyl(phenyl) iodonium tosylate (1) (0.5 g, 1.1 mmol), compound (i-1) (2.6 g, 6.1 mmol), DCM (20 mL), and water (20 mL). The contents were vigorously stirred at room temperature (23-25° C.) for 16 hours to mix the biphasic combination. The organic layer was then separated from the aqueous layer and extracted with deionized water (15 mL×3 times). Evaporation of the solvent and precipitation from MTBE afforded 0.4 g of the final compound (2) as a colorless oil at a yield of 54%. $^1$H-NMR (600 MHz Acetone-$d_6$, δ, ppm): 8.28 (d, 2H), 8.00 (dd, 1H), 7.74 (t, 1H), 7.68 (dd, 1H), 7.60 (t, 2H), 6.73 (dd, 1H), 4.29 (t, 2H), 2.61 (m, 2H), 2.18 (br, 2H), 1.80-1.55 (m, 12H); $^{13}$C-NMR (150 MHz Acetone-$d_6$, δ, ppm): 175.6, 152.2, 134.9, 132.6, 132.1, 126.5, 117.3, 114.1, 110.3, 66.9, 57.1, 46.3, 44.3, 43.7, 37.6, 35.0, 31.9, 31.7, 30.3, 29.8; $^{19}$F-NMR (600 MHz Acetone-$d_6$ δ, ppm): −112.4 (m, 2F), −119.2 (m, 2F).

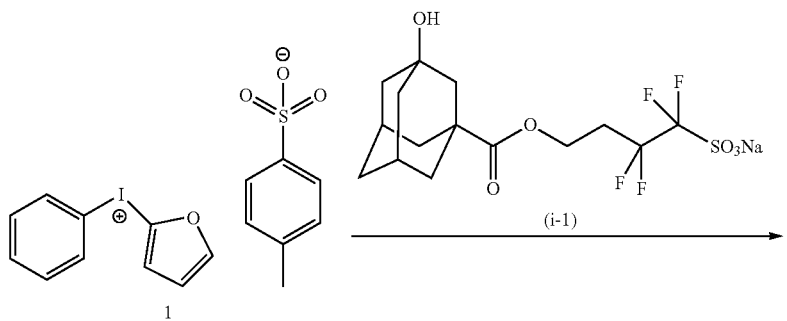

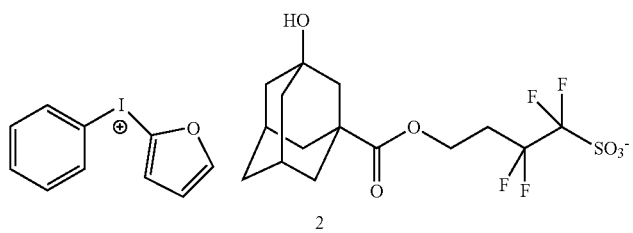

Synthesis of 2-Benzofuranyl(phenyl)iodonium tosylate (3)

A 250 mL RBF equipped with a stirring bar and a rubber septum was charged with benzofuran boronic acid (6.0 g, 0.0372 mol), 14.5 g of Koser's reagent (0.037 mol), and 50 mL of DCM. The reaction mixture was stirred for 2 hours after which time the formation of a white precipitate was observed. MTBE was added to the reaction mixture and the resulting precipitate was filtered and washed with an additional 50 mL of MTBE. Drying of the precipitate under vacuum gave 8.0 g of a white solid that was used in the next step without further purification.

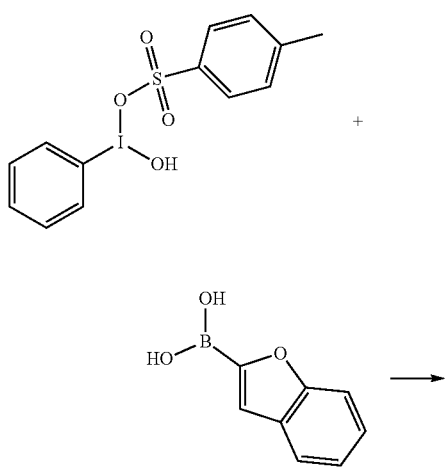

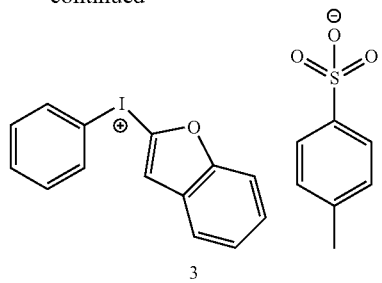

Synthesis of 2-Benzofuranyl(phenyl)iodonium 1,1,2,2-tetrafluoro-(3-hydroxyadamantane-1-carbonyl)oxy)butane-1-sulfonate (4)

A 200 mL RBF equipped with a stirring bar and rubber septum was charged with 2-benzofuranyl(phenyl)iodonium tosylate (3) (5.0 g, 10 mmol), compound (i-1) (6.5 g, 15 mmol), dichloromethane (20 mL), and water (20 mL). The resulting mixture was stirred at room temperature (23-25° C.) for 24 hours. The organic phase was separated from the aqueous phase, and the DCM was subsequently removed under vacuum from the organic phase. The final compound (4) was obtained by precipitation from DCM and MTBE to obtain a 5.0 g (67%) of a white solid. $^1$H-NMR (500 MHz δ, ppm): 8.08 (d, 2H), 7.73 (s, 1H), 7.67 (d, 1H), 7.59 (t, 1H), 7.53 (d, 1H), 7.45 (m, 3H), 7.33 (t, 1H), 4.24 (t, 2H), 2.54-2.45 (m, 2H), 2.23 (br, 2H), 1.82-1.56 (m, 14H); $^{13}$C-NMR (125 MHz CDCl$_3$, δ, ppm): 176.3, 158.8, 134.9, 132.6, 132.3, 127.9, 127.2, 124.7, 122.6, 122.4, 117.1, 115.3, 111.9, 68.6, 57.4, 46.30, 44.34, 37.6, 35.1, 31.6, 30.3; $^{19}$F-NMR (500 MHz-CDCl$_3$ δ, ppm): -112.1 (t, 2F), -117.7 (s, 2F).

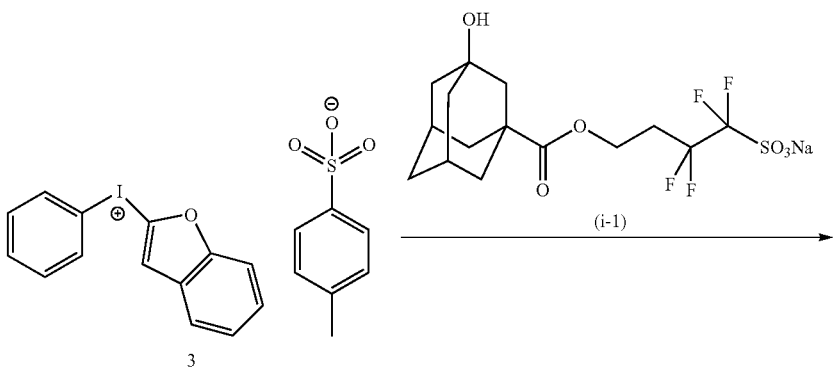

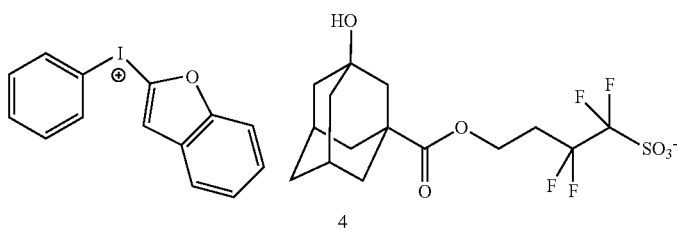

The chemical structures of polymers used in the examples and comparative examples are shown below. The acid-sensitive polymer P1 and the embedded barrier layer (EBL) F1 were prepared using methods commonly available in the art.

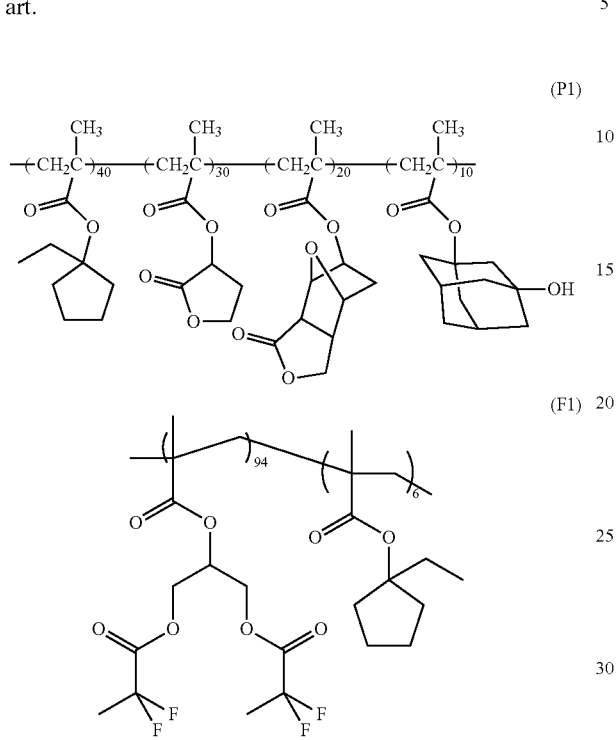

The chemical structures of photoactive compounds C1, 2, and 3, and the quencher compound D1 used in the examples and comparative examples are shown below.

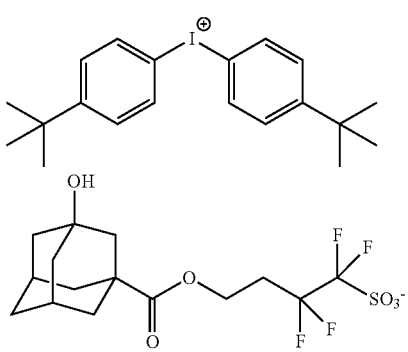

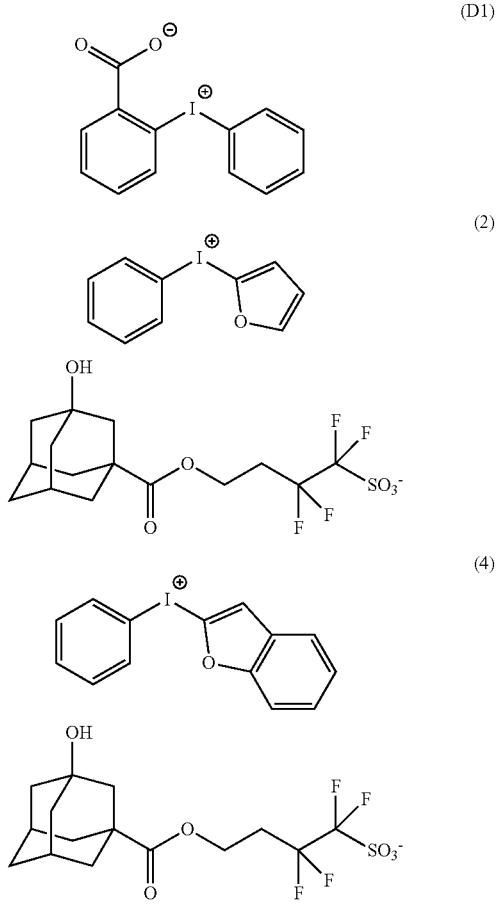

Compounds C1 and D1 were purchased from commercial sources and used as received. The solvents propylene glycol methyl ether acetate (S1) and methyl-2-hydroxyisobutyrate (S2) were used as received without further purification.

Photoresist Formulations

Photoresist compositions were prepared by dissolving solid components in solvents using the materials and amounts set forth in Table 1. The resulting mixtures, made on a 14-30 g scale, were shaken on a mechanical shaker for from 3 to 24 hours and then filtered through a PTFE disk-shaped filter having a pore size of 0.2 μm. The amounts of PAG, quencher, and EBL are reported as wt % based on the total solids.

TABLE 1

| Formulation | Polymer | PAG | Quencher | Solvents | EBL | $E_{size}$ (55 nm)* | $E_{size}$ (43 nm)* |
|---|---|---|---|---|---|---|---|
| Comparative 1 | P1 | C1 (13.144) | D1 (2.14) | S1/S2 (35/65) | F1 (3.0) | 55.2 | 72.5 |
| 1 | P1 | 2 (15.765) | D1 (2.14) | S1/S2 (35/65) | F1 (3.0) | 24.9 | 36.4 |
| 2 | P1 | 4 (11.953) | D1 (2.14) | S1/S2 (35/65) | F1 (3.0) | 48.7 | 64.3 |

*$E_{size}$ (mJ/cm$^2$) is for a 1:1 line/space (L/S) pattern as described below.

Example 1: Immersion Patterning

Immersion lithography was performed with a TEL Lithius 300 mm wafer track and ASML 1900i immersion scanner at 1.3 NA, 0.86/0.61 inner/outer sigma, and dipole illumination with 35Y polarization. Wafers for photolithographic testing were coated with an AR40A™ bottom antireflective coating (BARC) and cured at 205° C. for 60 seconds to give an 800 Å film. A coating of AR104 BARC™ was then disposed on the AR40A™ layer and cured at 175° C. for 60 seconds to give the top 400 Å film of the dual BARC stack. A photoresist composition was then coated onto the dual BARC stack and baked at 90° C. for 60 seconds to give a 400 Å resist film. Wafers were exposed targeting 55 nm/110 nm pitch and 43 nm/86 nm pitch 1:1 line/space (L/S) patterns using a focus exposure matrix and subjected to a PEB at 95° C. for 60 seconds. Following PEB, wafers were developed in 0.26 N TMAH solution for 12 seconds, rinsed with deionized water, and spun dry. Scanning electron microscopy (SEM) was performed to collect images and analyze printed patterns using a Hitachi CG4000 CD-SEM. Esize values are reported in units of mJ/cm². As shown in Table 1, the inventive photoresist compositions including PAG 2 or PAG 4 achieved a lower Esize at both 55 nm and 43 nm 1:1 L/S compared to the comparative photoresist composition including PAG-C1, indicating a faster photospeed relative to the comparative PAG $C_1$.

Calculated EUV Transmittance

The effect of using the furan-substituted iodonium PAG compounds on film absorption at EUV radiation was evaluated by the calculation of absorbance at this wavelength. The calculated transmittance at EUV exposure (13.5 nm) wavelengths for two exemplary furan-substituted iodonium cations and their respective phenyl and naphthyl analogues are reported in Table 2. The transmittance values were calculated from the Center for X-Ray Optics at Lawrence Berkeley National Laboratory website (https://henke.lbl.gov/optical_constants/) by inputting the calculated composition molecular formula and assuming a film density of 1.20 g/cm³ and film thickness of 100 nm.

TABLE 2

| Cation | Calculated Transmittance (13.5 nm) |
|---|---|
| A | 0.43 |
| A' | 0.46 |
| B | 0.47 |
| B' | 0.49 |

The structures of cation A (A), cation B (B), comparative cation A (A'), and comparative cation B (B') are as follows:

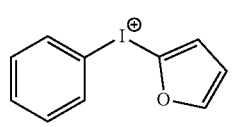

(A)

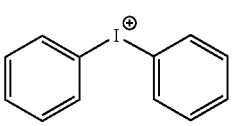

(A')

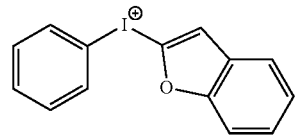

(B)

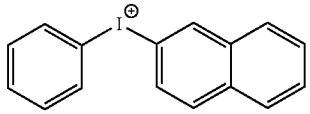

(B')

As can be seen from Table 2, the inventive PAG cations A and B achieve lower calculated transmittance at 13.5 nm compared with the comparative PAG cations A' and B'. The resulting increased EUV absorption for PAG cations A and B is desirable for improving EUV photoresist performance.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist composition, comprising:
   an acid-sensitive polymer comprising a repeating unit having an acid-labile group;
   an iodonium salt comprising an anion and a cation, wherein the cation comprises one, and not more than one, iodonium cation, the iodonium salt having Formula (1):

(1)

wherein, $Z^-$ is an organic anion comprising a group chosen from sulfonate, a methide anion, an anion of a sulfonamide, an anion of a sulfonimide, a sulfamate, a phenolate, or carboxylate;

$Ar^1$ is a substituted or unsubstituted $C_{4-60}$ heteroaryl group comprising a furan heterocycle; and $R^1$ is a $C_{1-20}$ alkyl group, a $C_{1-20}$ heteroalkyl group, a $C_{3-20}$ cycloalkyl group, a $C_{2-20}$ heterocycloalkyl group, a $C_{2-20}$ alkenyl group, a $C_{2-20}$ heteroalkenyl group, a $C_{6-30}$ aryl group, a $C_{4-30}$ heteroaryl group, a $C_{7-20}$ arylalkyl group, or a $C_{4-20}$ heteroarylalkyl group, each of which is substituted or unsubstituted, wherein the cation optionally comprises an acid-labile group, wherein $Ar^1$ and $R^1$ are optionally connected to each other via a single bond or one or more divalent linking groups to form a ring, and wherein the iodonium salt is optionally covalently bonded through $Ar^1$ or through a substituent thereof as a pendant group to a polymer, the iodonium salt is optionally covalently bonded through $R^1$ or through a substituent thereof as a pendant group to a polymer, or the iodonium salt is optionally covalently bonded through $Z^-$ as a pendant group to a polymer; and a solvent.

2. The photoresist composition of claim 1, wherein Ar$^1$ and R$^1$ are connected to each other via a single bond or a divalent linking group to form a ring.

3. The photoresist composition of claim 1, wherein Ar$^1$ is substituted with an acid-labile group, R$^1$ is substituted with an acid-labile group, or both Ar$^1$ and R$^1$ are each independently substituted with an acid-labile group.

4. The photoresist composition of claim 1, further comprising a photoacid generator, wherein the corresponding photoacid of the photoacid generator has a lower pKa than a corresponding photoacid of the iodonium salt. .

5. The photoresist composition of claim 1, further comprising a photo-decomposable quencher, wherein the corresponding photoacid of the photo-decomposable quencher has a higher pKa than a corresponding photoacid of the iodonium salt.

6. The photoresist composition of claim 1, wherein the acid-sensitive polymer comprises a repeating unit having an aromatic group, wherein the aromatic group is substituted or unsubstituted.

7. The photoresist composition of claim 1, wherein the C$_{4-60}$ heteroaryl group is

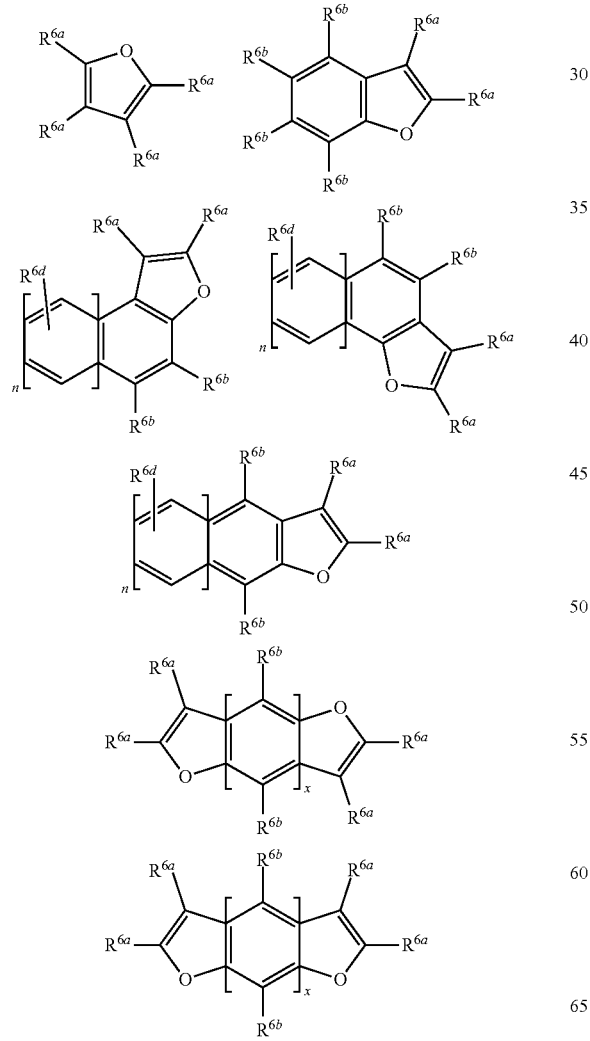

wherein,

R$^{6a}$, R$^{6b}$, R$^{6c}$, R$^{6d}$, R$^{6e}$, and R$^{6f}$ are each independently a single bond, hydrogen, substituted or unsubstituted C$_{1-30}$ alkyl, substituted or unsubstituted C$_{1-30}$ haloalkyl, substituted or unsubstituted C$_{3-30}$ cycloalkyl, substituted or unsubstituted C$_{1-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, substituted or unsubstituted C$_{4-30}$ heteroarylalkyl, halogen, —OR$^{61}$, —SR$^{62}$, or —NR$^{63}$R$^{64}$, wherein R$^{61}$ to R$^{64}$ are each independently hydrogen, or substituted or unsubstituted C$_{1-30}$ alkyl, substituted or unsubstituted C$_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl;

one of $R^{6a}$, $R^{6b}$, $R^{6c}$, $R^{6d}$, $R^{6e}$, or $R^{6f}$ is a single bond to the iodonium cation;

m is 0 to 6;

n is 0 to 6; and x is 1 to 6.

8. The photoresist composition of claim 1, wherein the iodonium salt is covalently bonded as a pendant group to a polymer.

9. A pattern formation method, comprising:
(a) applying a layer of a photoresist composition of claim 1 on a substrate;
(b) pattern-wise exposing the photoresist composition layer to activating radiation; and
(c) developing the exposed photoresist composition layer to provide a resist relief image.

10. The pattern formation method of claim 9, wherein the activating radiation is extreme ultraviolet radiation at a wavelength of 13.5 nanometers.

11. The pattern formation method of claim 9, wherein in the iodonium salt having Formula (1), $Ar^1$ and $R^1$ are connected to each other via a single bond or a divalent linking group to form a ring.

12. The pattern formation method of claim 9, wherein in the iodonium salt having Formula (1), $Ar^1$ is substituted with an acid-labile group, $R^1$ is substituted with an acid-labile group, or both $Ar^1$ and $R^1$ are each independently substituted with an acid-labile group.

13. The pattern formation method of claim 9, wherein the photoresist composition further comprises a photoacid generator, wherein the corresponding photoacid of the photoacid generator has a lower pKa than a corresponding photoacid of the iodonium salt.

14. The pattern formation method of claim 9, wherein the photoresist composition further comprises a photo-decomposable quencher, wherein the corresponding photoacid of the photo-decomposable quencher has a higher pKa than a corresponding photoacid of the iodonium salt.

15. The pattern formation method of claim 9, wherein in the photoresist composition, the acid-sensitive polymer comprises a repeating unit having an aromatic group, wherein the aromatic group is substituted or unsubstituted.

16. The pattern formation method of claim 9, wherein in the iodonium salt having Formula (1), the $C_{4-60}$ heteroaryl group is

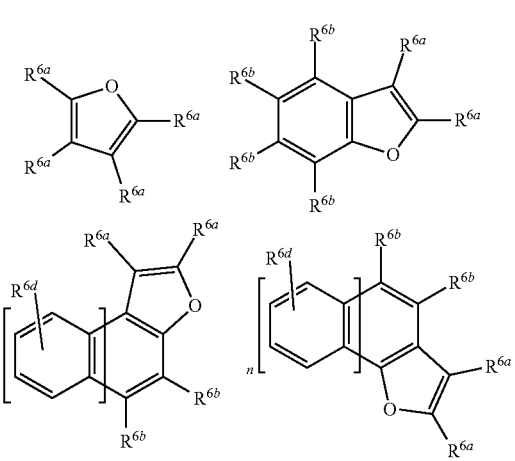

-continued

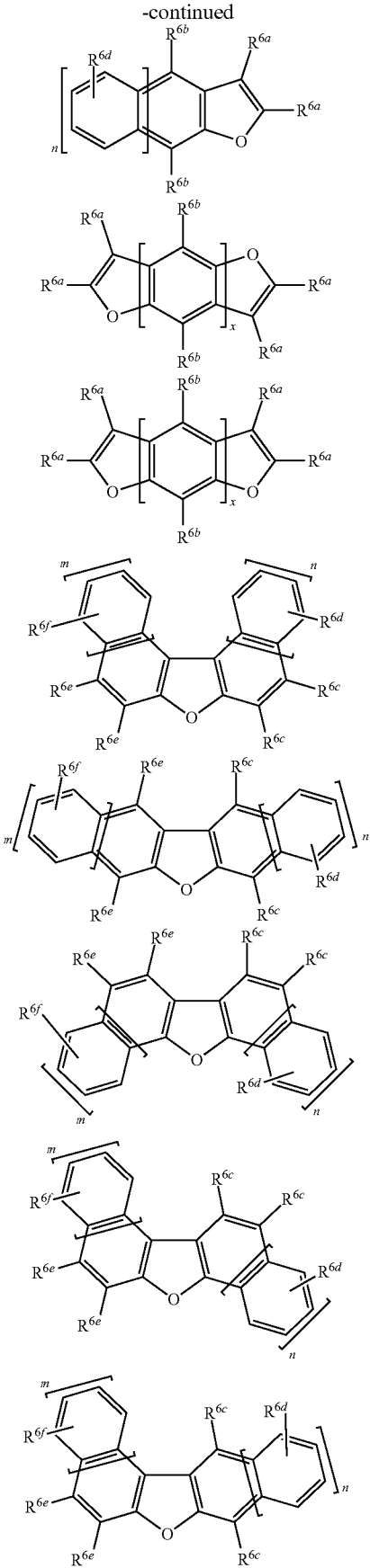

-continued

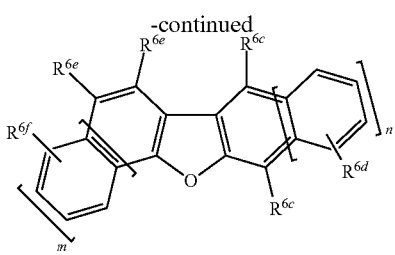

wherein, $R^{6a}$, $R^{6b}$, $R^{6c}$, $R^{6d}$, $R^{6e}$, and $R^{6f}$ are each independently a single bond, hydrogen, substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, $-OR^{61}$, $-SR^{62}$, or $-NR^{63}R^{64}$, wherein $R^{61}$ to $R^{64}$ are each independently hydrogen, or substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl;

one of $R^{6a}$, $R^{6b}$, $R^{6c}$, $R^{6d}$, $R^{6e}$, or $R^{6f}$ is a single bond to the iodonium cation;

m is 0 to 6;

n is 0 to 6; and x is 1 to 6.

17. The pattern formation method of claim 9, wherein in the photoresist composition, the iodonium salt is covalently bonded as a pendant group to a polymer.

\* \* \* \* \*